US009583217B2

(12) United States Patent
Lin et al.

(10) Patent No.: US 9,583,217 B2
(45) Date of Patent: Feb. 28, 2017

(54) DECODING METHOD, MEMORY STORAGE DEVICE AND MEMORY CONTROL CIRCUIT UNIT

(71) Applicant: PHISON ELECTRONICS CORP., Miaoli (TW)

(72) Inventors: Wei Lin, Taipei (TW); Shao-Wei Yen, Kaohsiung (TW); Yu-Hsiang Lin, Yunlin County (TW); Kuo-Hsin Lai, Hsinchu County (TW)

(73) Assignee: PHISON ELECTRONICS CORP., Miaoli (TW)

( * ) Notice: Subject to any disclaimer, the term of this patent is extended or adjusted under 35 U.S.C. 154(b) by 308 days.

(21) Appl. No.: 14/296,383

(22) Filed: Jun. 4, 2014

(65) Prior Publication Data
US 2015/0293813 A1 Oct. 15, 2015

(30) Foreign Application Priority Data
Apr. 15, 2014 (TW) .............................. 103113690 A

(51) Int. Cl.
G11C 29/00 (2006.01)
G11C 29/52 (2006.01)
H03M 13/37 (2006.01)
G06F 11/10 (2006.01)
G11C 29/04 (2006.01)

(52) U.S. Cl.
CPC .......... G11C 29/52 (2013.01); G06F 11/1012 (2013.01); H03M 13/3746 (2013.01); G11C 2029/0411 (2013.01)

(58) Field of Classification Search
CPC ............. G06F 11/1076; G06F 11/1008; G06F 11/1068; H05K 999/99; G06F 11/1044
USPC ......................................................... 714/763
See application file for complete search history.

(56) References Cited

U.S. PATENT DOCUMENTS

| 7,653,862 B2 | 1/2010 | Hassner et al. |
| 8,732,564 B2* | 5/2014 | Chinnici ............ H03M 13/1111 714/752 |
| 9,294,132 B1* | 3/2016 | Peleato-Inarrea . H03M 13/2948 |
| 2006/0200727 A1* | 9/2006 | Akiyama ................ G11C 29/42 714/763 |
| 2011/0167305 A1* | 7/2011 | Haratsch .................. G11C 7/02 714/42 |

OTHER PUBLICATIONS

"Office Action of Taiwan Counterpart Application", issued on Jun. 29, 2015, p. 1-p. 4.

* cited by examiner

Primary Examiner — Albert Decady
Assistant Examiner — Enam Ahmed
(74) Attorney, Agent, or Firm — Jianq Chyun IP Office

(57) ABSTRACT

A decoding method, a memory storage device and a memory control circuit unit are provided, the decoding method includes: reading a plurality of memory cells according to hard decision voltage to obtain hard bit; performing a parity check procedure for the hard bit to obtain a plurality of syndromes; determining whether the hard bit has error according to the syndromes; if the hard bit has the error, updating the hard bit according to channel information of the hard bit and syndrome weight information corresponding to the hard bit.

21 Claims, 11 Drawing Sheets

DECODING METHOD, MEMORY STORAGE DEVICE AND MEMORY CONTROL CIRCUIT UNIT

CROSS-REFERENCE TO RELATED APPLICATION

This application claims the priority benefit of Taiwan application serial no. 103113690, filed on Apr. 15, 2014. The entirety of the above-mentioned patent application is hereby incorporated by reference herein and made a part of this specification.

BACKGROUND

Technical Field

The invention relates to a decoding method, and more particularly, to a decoding method regarding a low density parity check code, a memory storage device and a memory control circuit unit using the same.

Description of Related Art

The markets of digital cameras, cellular phones, and MP3 players have expanded rapidly in recent years, resulting in escalated demand for storage media by consumers. The characteristics of data non-volatility, low power consumption, and compact size make a rewritable non-volatile memory module (e.g., flash memory) ideal to be built in the portable multi-media devices as cited above.

Generally, a channel encoding is performed to data written in the rewritable non-volatile memory module. As a result, when the data are read from the rewritable non-volatile memory module, errors in the data may have a chance to be corrected. In case the channel encoding utilizes a low density parity check code, an iteration decoding is performed to the data read from the rewritable non-volatile memory module. The iteration decoding is configured to update a reliability of one bit. A number of iterations required for the iteration decoding also increases when there is more errors in the data. However, a higher number of iterations results in a slower speed for decoding. Therefore, how to increase a speed of decoding is one of the major subjects for person skilled in the art.

Nothing herein should be construed as an admission of knowledge in the prior art of any portion of the present invention. Furthermore, citation or identification of any document in this application is not an admission that such document is available as prior art to the present invention, or that any reference forms a part of the common general knowledge in the art.

SUMMARY

The invention is directed to a decoding method, a memory storage device and a memory control circuit unit, and capable of collecting additional channel information to serve as a basis of correcting error.

A decoding method is provided according an exemplary embodiment of the invention for a rewritable non-volatile memory module having a plurality of memory cells, and the decoding method includes: reading the memory cells according to at least one hard decision voltage to obtain at least one hard bit; performing a parity checking procedure for the hard bit to obtain a plurality of syndromes, wherein the hard bit is corresponding to at least one of the syndromes; determining whether the hard bit has at least one error according to the syndromes; if the hard bit has the error, updating the hard bit according to channel information of the hard bit and syndrome weight information corresponding to the hard bit; and if the hard bit does not have the error, outputting the hard bit.

A memory storage device is provided according to an exemplary embodiment of the invention, which includes a connection interface unit, a rewritable non-volatile memory module and a memory control circuit unit. The connection interface unit is configured to couple to a host system. The rewritable non-volatile memory module includes a plurality of memory cells. The memory control circuit unit is coupled to the connection interface unit and the rewritable non-volatile memory module. Therein, the memory control circuit unit is configured to read the memory cells according to at least one hard decision voltage to obtain at least one hard bit. The memory control circuit unit is further configured to perform a parity checking procedure for the hard bit to obtain a plurality of syndromes, wherein the hard bit is corresponding to at least one of the syndromes. The memory control circuit unit is further configured to determine whether the hard bit has at least one error according to the syndromes. If the hard bit has the error, the memory control circuit unit is further configured to update the hard bit according to channel information of the hard bit and syndrome weight information corresponding to the hard bit. If the hard bit does not have the error, the memory control circuit unit is further configured to output the hard bit.

A memory control circuit unit for a rewritable non-volatile memory module is provided, and the rewritable non-volatile memory module includes a plurality of memory cells, and the memory control circuit unit includes a host interface, a memory interface, an error checking and correcting circuit, and a memory management circuit. The host interface is configured to couple to a host system. The memory interface is used for coupling to the rewritable non-volatile memory module. The memory management circuit is coupled to the host interface, the memory interface and the error checking and correcting circuit. Therein, the memory control circuit unit is configured to send a read command sequence, wherein the read command sequence is configured to instruct for reading the memory cells according to at least one hard decision voltage to obtain at least one hard bit. The error checking and correcting circuit is configured to perform a parity checking procedure for the hard bit to obtain a plurality of syndromes, wherein the hard bit is corresponding to at least one of the syndromes. The error checking and correcting circuit is further configured to determine whether the hard bit has at least one error according to the syndromes. If the hard bit has the error, the error checking and correcting circuit is further configured to update the hard bit according to channel information of the hard bit and syndrome weight information corresponding to the hard bit. If the hard bit does not have the error, the memory management circuit is further configured to output the hard bit.

Based on above, when the bit read from the rewritable non-volatile memory module includes the error, an exemplary embodiment of the invention is capable of deciding which bits are to be updated according to the channel information of each of the bits and the syndrome weight information corresponding to each of the bits. Accordingly, in comparison to conventional method in which the codeword is updated only according to a result of the iteration calculation each time, an exemplary embodiment of the invention is capable of effectively improving decoding efficiency.

To make the above features and advantages of the disclosure more comprehensible, several embodiments accompanied with drawings are described in detail as follows.

It should be understood, however, that this Summary may not contain all of the aspects and embodiments of the present invention, is not meant to be limiting or restrictive in any manner, and that the invention as disclosed herein is and will be understood by those of ordinary skill in the art to encompass obvious improvements and modifications thereto.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
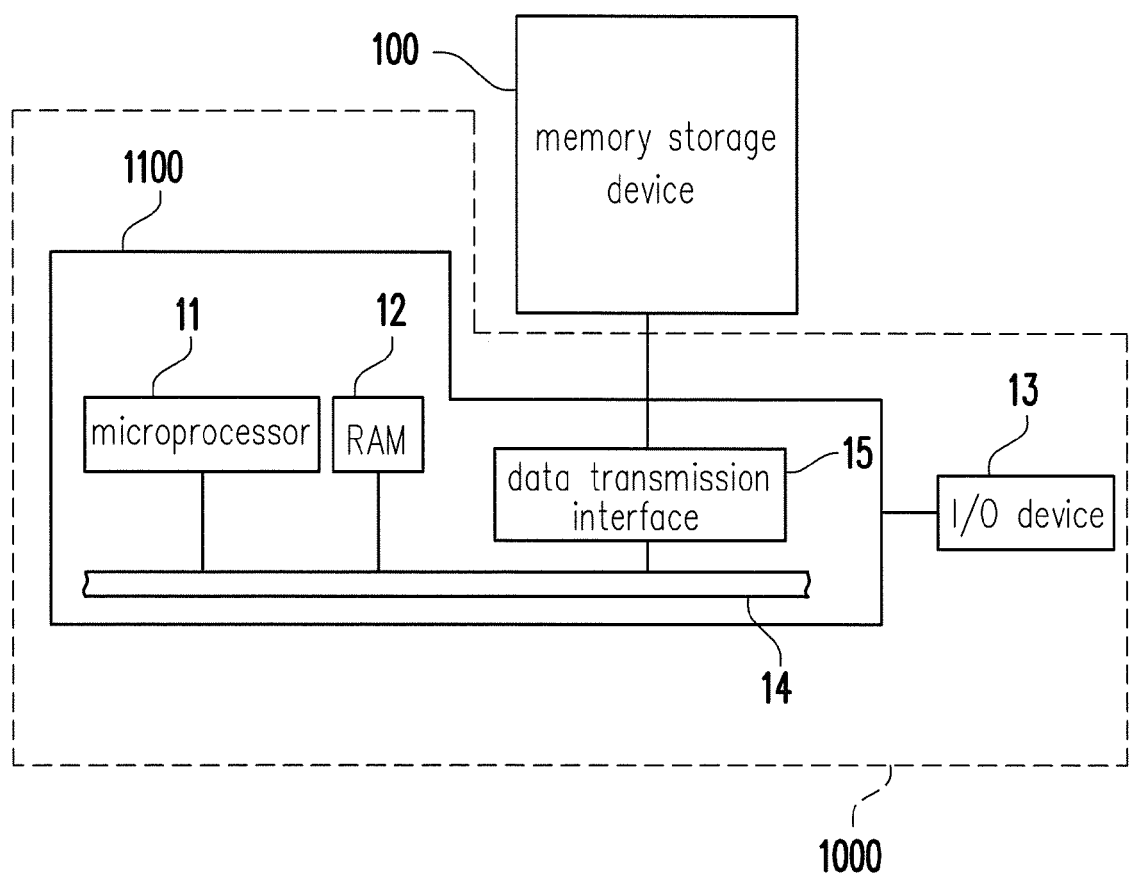
FIG. 1 is a schematic diagram of a host system and a memory storage device according to an exemplary embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

Embodiments of the present invention may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least on of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

Generally, a memory storage device (also known as a memory storage system) includes a rewritable non-volatile memory module and a controller (also known as a control circuit). The memory storage device is usually configured together with a host system so that the host system may write data into or read data from the memory storage device.

Figure 2:
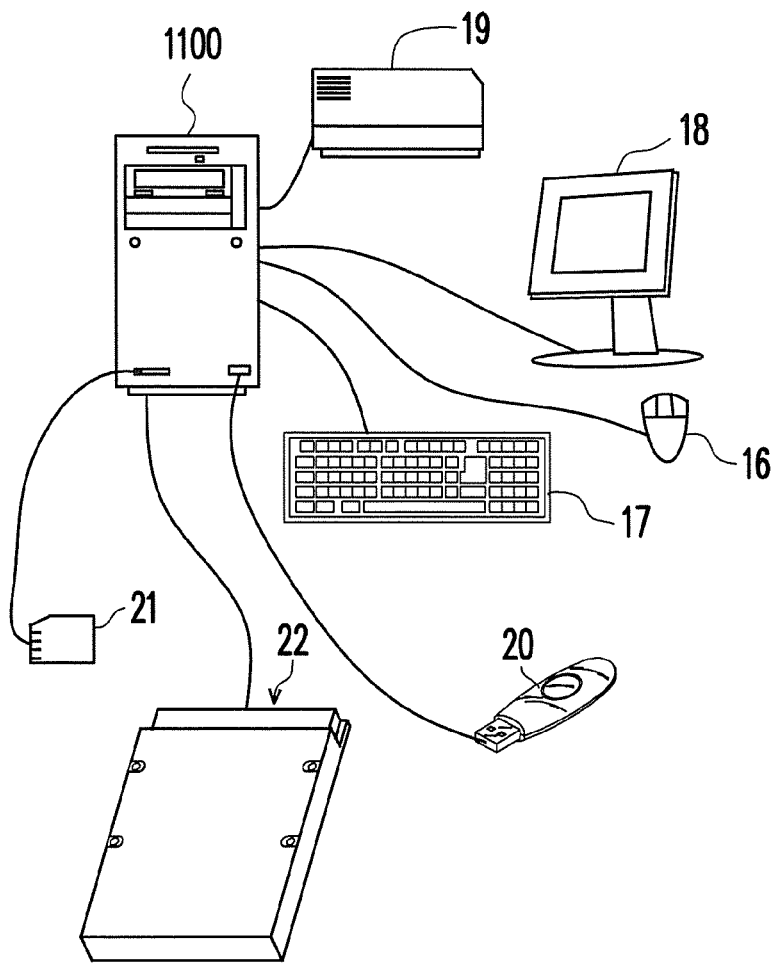
FIG. 2 is a schematic diagram illustrating a computer, an input/output device and a memory storage device according to an exemplary embodiment.

FIG. 1 is a schematic diagram of a host system and a memory storage device according to an exemplary embodiment. FIG. 2 is a schematic diagram illustrating a computer, an input/output device and a memory storage device according to an exemplary embodiment.

Referring to FIG. 1, a host system 1000 includes a computer 1100 and an input/output (I/O) device 13. The computer 1100 includes a microprocessor 11, a random access memory (RAM) 12, a system bus 14, and a data transmission interface 15. For example, the I/O device 13 includes a mouse 16, a keyboard 17, a display 18 and a printer 19 as shown in FIG. 2. It should be understood that the devices illustrated in FIG. 2 are not intended to limit the I/O device 13, and the I/O device 13 may further include other devices.

In the present embodiment of the invention, the memory storage device 100 is coupled to other devices of the host system 1000 through the data transmission interface 15. By using the microprocessor 11, the random access memory 12 and the Input/Output (I/O) device 13, data may be written into the memory storage device 100 or may be read from the memory storage device 100. For example, the memory storage device 100 may be a rewritable non-volatile memory storage device such as a flash drive 20, a memory card 21, or a solid state drive (SSD) 22 as shown in FIG. 2.

Figure 3:
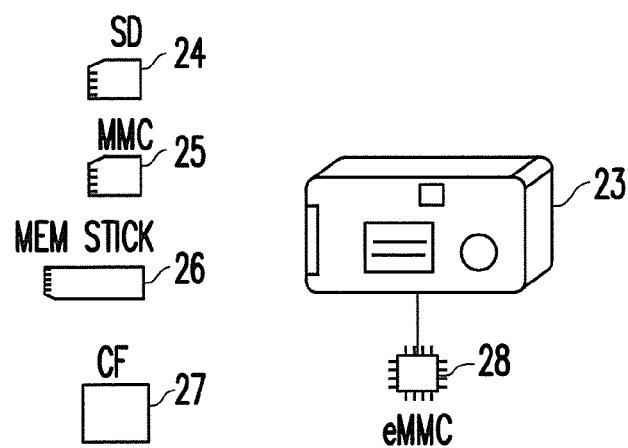
FIG. 3 is a schematic diagram of a host system and a memory storage device according to an exemplary embodiment.

FIG. 3 is a schematic diagram of a host system and a memory storage device according to an exemplary embodiment.

Generally, the host system 1000 may substantially be any system capable of storing data with the memory storage device 100. Although the host system 1000 is described as a computer system in the present exemplary embodiment, in another exemplary embodiment of the invention, the host system 1000 may be a digital camera, a video camera, a telecommunication device, an audio player, or a video player. For example, when the host system is a digital camera (video camera) 23, the rewritable non-volatile memory storage device may be a SD card 24, a MMC card 25, a memory stick 26, a CF card 27 or an embedded storage device 28 (as shown in FIG. 3). The embedded storage device 28 includes an embedded MMC (eMMC). It should be mentioned that the eMMC is directly coupled to a substrate of the host system.

Figure 4:
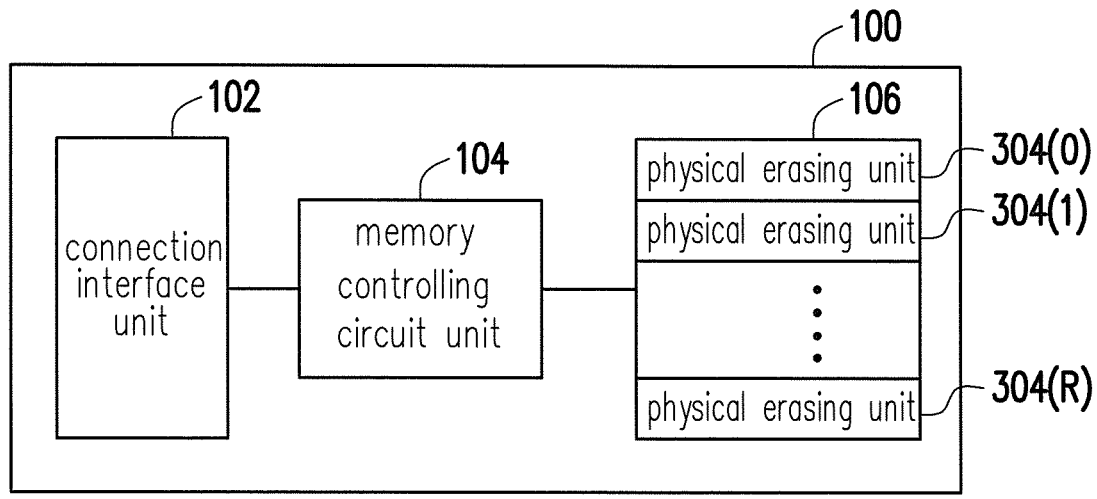
FIG. 4 is a schematic block diagram of the memory storage device in FIG. 1.

FIG. 4 is a schematic block diagram of the memory storage device in FIG. 1.

Referring to FIG. 4, the memory storage device 100 includes a connection interface unit 102, a memory control circuit unit 104 and a rewritable non-volatile memory storage module 106.

In the present exemplary embodiment, the connection interface unit 102 is compatible with a serial advanced technology attachment (SATA) standard. However, the invention is not limited thereto, and the connection interface unit 102 may also be compatible with a Parallel Advanced Technology Attachment (PATA) standard, an Institute of Electrical and Electronic Engineers (IEEE) 1394, standard, a peripheral component interconnect (PCI) Express interface standard, a universal serial bus (USB) standard, a secure digital (SD) interface standard, a Ultra High Speed-I (UHS-I) interface standard, a Ultra High Speed-II (UHS-II) interface standard, a memory stick (MS) interface standard, a multi media card (MMC) interface standard, an embedded MMC (eMMC) interface standard, a Universal Flash Storage (UFS) interface standard, a compact flash (CF) interface standard, an integrated device electronics (IDE) interface standard or other suitable standards. The connection interface unit 102 and the memory control circuit unit 104 may be packaged into one chip, or the connection interface unit 102 is distributed outside of a chip containing the memory control circuit unit 104.

The memory control circuit unit 104 is configured to execute a plurality of logic gates or control commands which are implemented in a hardware form or in a firmware form, so as to perform operations of writing, reading or erasing data in the rewritable non-volatile memory storage module 106 according to the commands of the host system 1000.

The rewritable non-volatile memory storage module 106 is coupled to the memory control circuit unit 104 and configured to store data written from the host system 1000. The rewritable non-volatile memory storage module 106 has multiple physical erasing units 304(0) to 304(R). For example, the physical erasing units 304(0) to 304(R) may belong to the same memory die or belong to different memory dies. Each physical erasing unit has a plurality of physical programming units, and the physical programming units of the same physical erasing unit may be written separately and erased simultaneously. For example, each physical erasing unit is composed by 128 physical programming units. Nevertheless, it should be understood that the invention is not limited thereto. Each physical erasing unit is composed by 64 physical programming units, 256 physical programming units or any amount of the physical programming units.

More specifically, each of the physical programming units includes a plurality of word lines and a plurality of bit lines, and a memory cell is disposed at an intersection of each of the word lines and each of the data lines. Each memory cell can store one or more bits. All of the memory cells in the same physical erasing unit are erased together. In the present exemplary embodiment, the physical erasing unit is a minimum unit for erasing. Namely, each physical erasing unit contains the least number of memory cells to be erased together. For instance, the physical erasing unit is a physical block. Furthermore, the memory cells on the same word line can be grouped into one or more of the physical programming units. In case each of the memory cells can store more than two bits, the physical programming units on the same word line can be classified into a lower physical programming unit and an upper physical programming unit. Generally, a writing speed of the lower physical programming unit is faster than a writing speed of the upper physical programming unit. In the present exemplary embodiment, the physical programming unit is a minimum unit for programming. That is, the physical programming unit is the minimum unit for writing data. For example, the physical programming unit is a physical page or a physical sector. In case the physical programming unit is the physical page, each physical programming unit usually includes a data bit area and a redundancy bit area. The data bit area has multiple physical sectors configured to store user data, and the redundant bit area is configured to store system data (e.g., an error correcting code). In the present exemplary embodiment, each of the data bit areas contains 32, physical sectors, and a size of each physical sector is 512-byte (B). However, in other exemplary embodiments, the data bit area may also include 8, 16, or more or less of the physical sectors, and amount and sizes of the physical sectors are not limited in the invention.

In the present exemplary embodiment, the rewritable non-volatile memory module 106 is a Single Level Cell (SLC) NAND flash memory module in which one memory cell is capable of storing one bit. However, the invention is not limited thereto. The rewritable non-volatile memory module 106 may also be a Multi Level Cell (MLC) NAND flash memory module, a Trinary Level Cell (TLC) NAND flash memory module, other flash memory modules or any memory module having the same features.

Figure 5:
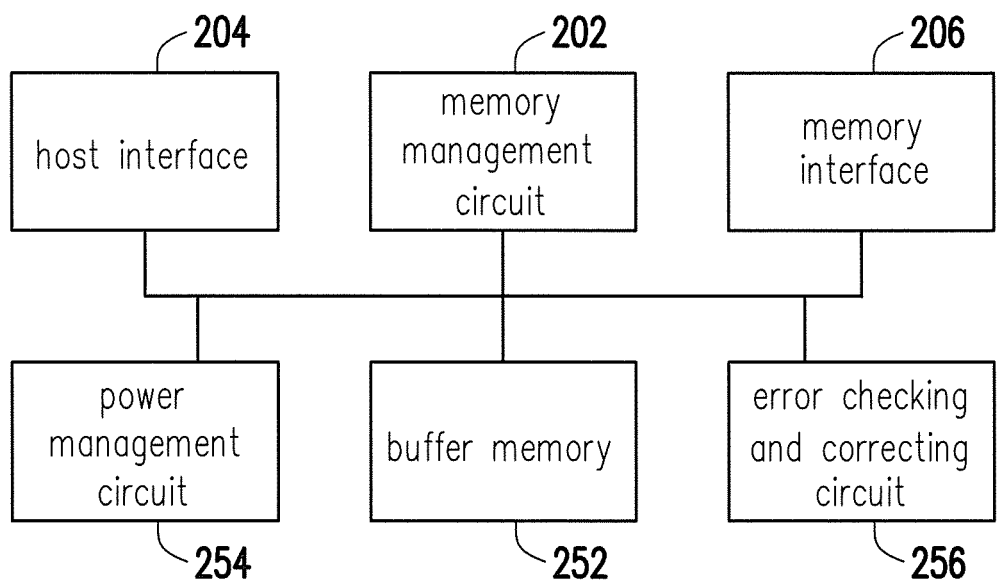
FIG. 5 is a schematic block diagram illustrating a memory control circuit unit according to an exemplary embodiment.

FIG. 5 is a schematic block diagram illustrating a memory control circuit unit according to an exemplary embodiment.

Referring to FIG. 5, the memory control circuit unit 104 includes a memory management circuit 202, a host interface 204 and a memory interface 206.

The memory management circuit 202 is configured to control overall operations of the memory control circuit unit 104. Specifically, the memory management circuit 202 has a plurality of control commands. During operations of the memory storage device 100, the control commands are executed to perform various operations such as writing, reading and erasing data. Operations of the memory management circuit 202 are similar to the operations of the memory control circuit unit 104, thus related description is omitted hereinafter.

In the present exemplary embodiment, the control commands of the memory management circuit 202 are implemented in a faun of a firmware. For instance, the memory management circuit 202 has a microprocessor unit (not illustrated) and a ROM (not illustrated), and the control commands are burned into the ROM. When the memory storage device 100 operates, the control commands are executed by the microprocessor to perform operations of writing, reading or erasing data.

In another exemplary embodiment of the invention, the control commands of the memory management circuit 202 may also be stored as program codes in a specific area (for example, the system area in a memory exclusively used for storing system data) of the rewritable non-volatile memory module 106. In addition, the memory management circuit 202 has a microprocessor unit (not illustrated), a ROM (not illustrated) and a RAM (not illustrated). More particularly, the ROM has a boot code, which is executed by the microprocessor unit to load the control commands stored in the rewritable non-volatile memory module 106 to the RAM of the memory management circuit 202 when the memory control circuit unit 104 is enabled. Next, the control commands are executed by the microprocessor unit to perform operations of writing, reading or erasing data.

Further, in another exemplary embodiment of the invention, the control commands of the memory management circuit 202 may also be implemented in a form of hardware. For example, the memory management circuit 202 includes a microcontroller, a memory writing unit, a memory reading unit, a memory erasing unit and a data processing unit. The memory management unit, the memory writing unit, the memory reading unit, the memory erasing unit and the data processing unit are coupled to the microprocessor. The memory management unit is configured to manage the physical erasing units of the rewritable non-volatile memory module 106; the memory writing unit is configured to issue a write command to the rewritable non-volatile memory module 106 in order to write data to the rewritable non-volatile memory module; the memory reading unit is configured to issue a read command to the rewritable non-volatile memory module 106 in order to read data from the rewritable non-volatile memory module 106; the memory erasing unit is configured to issue an erase command to the rewritable non-volatile memory module 106 in order to erase data from the rewritable non-volatile memory module 106; the data processing unit is configured to process both the data to be written to the rewritable non-volatile memory module 106 and the data to be read from the rewritable non-volatile memory module 106.

The host interface 204 is coupled to the memory management circuit 202 and configured to receive and identify commands and data sent from the host system 1000. Namely, the commands and data sent from the host system 1000 are passed to the memory management circuit 202 through the host interface 204. In the present exemplary embodiment, the host interface 204 is compatible with a SATA standard. However, it should be understood that the present invention is not limited thereto, and the host interface 204 may also be compatible with a PATA standard, an IEEE 1394 standard, a PCI Express standard, a USB standard, a SD standard, a UHS-I standard, a UHS-II standard, a MS standard, a MMC standard, a eMMC standard, a UFS standard, a CF standard, an IDE standard, or other suitable standards for data transmission.

The memory interface 206 is coupled to the memory management circuit 202 and configured to access the rewritable non-volatile memory module 106. That is, data to be written to the rewritable non-volatile memory module 106 is converted to a format acceptable to the rewritable non-volatile memory module 106 through the memory interface 206.

In an exemplary embodiment of the invention, the memory control circuit unit 104 further includes a buffer memory 252, a power management circuit 254 and an error checking and correcting circuit 256.

The buffer memory 252 is coupled to the memory management circuit 202 and configured to temporarily store data and commands from the host system 1000 or data from the rewritable non-volatile memory module 106.

The power management unit 254 is coupled to the memory management circuit 202 and configured to control a power of the memory storage device 100.

The error checking and correcting circuit 256 is coupled to the memory management circuit 202 and configured to perform an error checking and correcting process to ensure the correctness of data. Specifically, when the memory management circuit 202 receives a write command from the host system 1000, the error checking and correcting circuit 256 generates an error correcting code (ECC code) for data corresponding to the write command, and the memory management circuit 202 writes data and the ECC code corresponding to the write command to the rewritable non-volatile memory module 106. Subsequently, when the memory management circuit 202 reads the data from the rewritable non-volatile memory module 106, the ECC code corresponding to the data is also read, and the error checking and correcting circuit 256 may execute the error checking and correcting procedure for the read data according to the ECC code.

In the present exemplary embodiment, the error correcting code used by the error checking and correcting circuit 256 is a low density parity check (LDPC) code. In other words, the error checking and correcting circuit 256 encodes and decodes according to a low density parity check algorithm. The error checking and correcting circuit 256 sets a parity check matrix with a dimension being "m-by-n". Therein, m and n are positive integers. The positive integers n indicate a number of bits in one codeword, and the positive integer m indicates a number of parity check bit in one codeword. Accordingly, a difference obtained from subtracting the positive integer m by the positive integer n (n-m) indicates a number of information bit (or a message bit) in one codeword.

Figure 6:
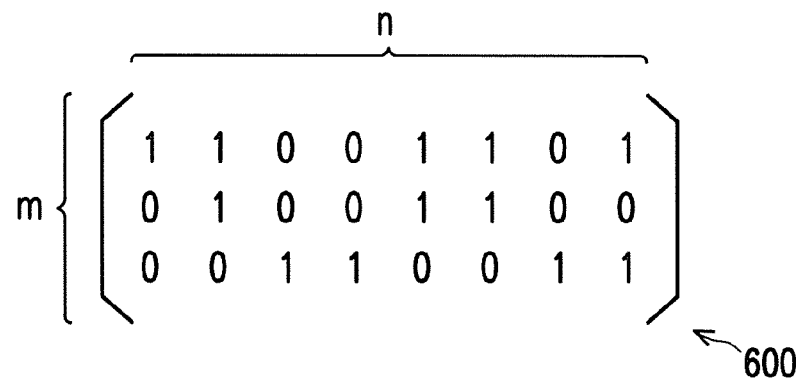
FIG. 6 is a schematic diagram illustrating a parity check matrix according to an exemplary embodiment.

FIG. 6 is a schematic diagram illustrating a parity check matrix according to an exemplary embodiment.

Referring to FIG. 6, a parity check matrix 600 has a dimension being 3-by-8. Generally, the positive integers m and n are greater than 3, and 8. FIG. 6 is merely an example of the invention, and values of the positive integers m and n are not particularly limited. Each row in the parity check matrix 600 also represents a constraint. Take first row as an example, if one codeword is a valid codeword, a bit "0" can be obtained after performing a modulo-2, addition to first, second, fifth, sixth, and eighth bits in the codeword. Persons skilled in the art should be able to understand how to encode by using the parity check matrix 600, thus related description is omitted hereinafter.

When the memory control circuit unit 104 (or the memory management circuit 202) writes a plurality of bits to the rewritable non-volatile memory module 106, the error checking and correcting circuit 256 correspondingly generates m parity check bits for each (n-m) of the bits to be written. Then, the memory control circuit unit 104 (or the memory management circuit 202) writes the n bits to the rewritable non-volatile memory module 106. The rewritable non-volatile memory module 106 stores one or more bits by changing a threshold voltage of one memory cell.

Figure 7:
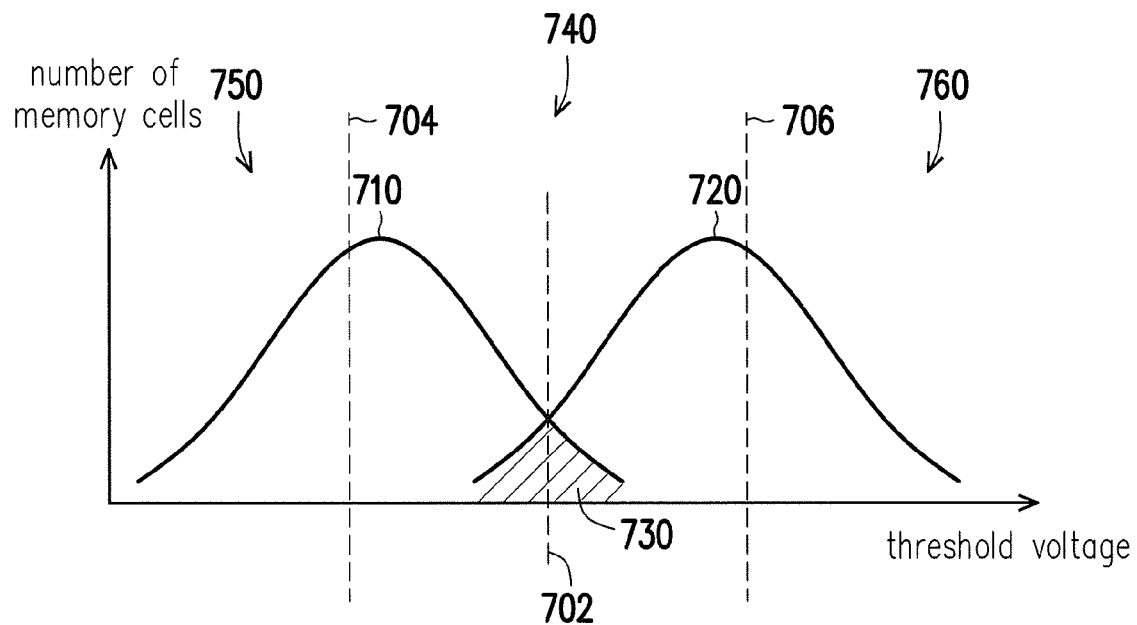
FIG. 7 is a schematic diagram illustrating an example of reading the rewritable non-volatile memory module according to a hard decision voltage according to an exemplary embodiment.

FIG. 7 is a schematic diagram illustrating an example of reading the rewritable non-volatile memory module according to a hard decision voltage according to an exemplary embodiment.

Referring to FIG. 7, a horizontal axis represents the threshold voltage of the memory, and a vertical axis represents a number of the memory cells. For instance, FIG. 7 illustrates the threshold voltage of each memory cell on one specific word line. It is assumed that, when the threshold voltage of the specific memory cell falls in a distribution 710, the bit stored in the memory cell is the bit "1". Otherwise, when the threshold voltage of the specific memory cell falls in a distribution 720, the bit stored in the memory cell is the bit "0". It is worth mentioning that, the present exemplary embodiment takes a SLC-type flash memory module for example, thus there are two possible distributions for the threshold voltages. However, in other exemplary embodiments, the threshold voltages may include four, eight or any number of possible distributions, and a hard decision voltage 702 may fall between any two of the distributions. In addition, the bit represented by each distribution is not particularly limited in the invention.

In the present exemplary embodiment, when it comes to read the data from the rewritable non-volatile memory module 106, the memory control circuit unit 104 (or the memory management circuit 202) sends a read command sequence to the rewritable non-volatile memory module 106. The read command sequence includes one or more commands or program codes, and is configured to instruct for reading the physical programming unit composed of a plurality of memory cells according to the hard decision voltage 702 to obtain a plurality of bits. In case the threshold voltage of a specific memory cell is less than the hard decision voltage 702, that specific memory cell is then turned on, and the bit "1" is read by the memory control circuit unit 104 (or the memory management circuit 202). Otherwise, in case the threshold voltage of a specific memory cell is greater than the hard decision voltage 702, that specific memory cell is not turned on, and the bit "0" is read by the memory control circuit unit 104 (or the memory management circuit 202). It should be noted that, a distribution 710 and a distribution 720 include an overlap region 730. The overlap region 730 represents that some of the memory cells are supposed to be stored with the bit "1" (which belongs to the distribution 710) yet having the threshold voltages thereof being greater than the hard decision voltage 702; or, some of the memory cells are supposed to be stored with the bit "0" (which belongs to the distribution 720) yet having the threshold voltages thereof being less than the hard decision voltage 702. In other words, a part of bits among all the bits being read may have errors. For illustrative convenience, the bits being read according to the hard decision voltage are collectively referred to as hard bits hereinafter.

In the present exemplary embodiment, each of the hard bits corresponds to one channel information, which is configured to instruct for reading out whether the threshold voltage of the memory cell of the hard bit fall within a stable region or an unstable region. More specifically, if the channel information of one hard bit indicates that the threshold voltage of the corresponding memory cell falls within the stable region, it indicates that the hard bit has higher probability of being correct. Otherwise, if the channel information of one hard bit indicates that the threshold voltage of the corresponding memory cell falls within the unstable region, it indicates that the hard bit has higher probability of being incorrect. For example, in the exemplary embodiment of FIG. 7, it is assumed that soft decision voltages 704 and 706 are used to cut the distribution 710 and the distribution 720, such that the distribution 710 and the distribution 720 may be divided into an unstable region 740, a stable region 750 and a stable region 760. The unstable region 740 is a region between the soft decision voltages 704 and 706; the stable region 750 is a region on the left of the soft decision voltage 704; and the stable region 760 is a region of the right of the soft decision voltage 706. The unstable region 740 includes at least a part of the overlap region 730. Generally speaking, if the threshold voltage of one memory cell falls within the unstable region 740, the hard bit read from such memory cell has higher probability of being incorrect. Nonetheless, if the threshold voltage of one memory cell falls within the stable regions 750 or 760, the hard bit read from such memory cell has higher probability of being correct. In this exemplary embodiment, the soft decision voltages 704 and 706 are decided according to the hard decision voltage 702. Therein, the soft decision voltage 704 is less than the hard decision voltage 702, and the soft decision voltage 706 is greater than the hard decision voltage 702. In an exemplary embodiment, one hard decision voltage may be corresponding to a combination of multiple soft decision voltages, and each combination of the soft decision voltages may be recited in a look-up table for query and use. For example, the soft decision voltages 704 and 706 in one combination of the soft decision voltages may be greater than the soft decision voltages 704 and 706 in another combination of the soft decision voltages. In another exemplary embodiment, the soft decision voltages being used each time may be randomly decided according to the hard decision voltage 702 within a preset voltage range.

In the present exemplary embodiment, the channel information of one hard bit includes one or more soft bits. The memory control circuit unit 104 (or the memory management circuit 202) is capable of reading the memory cells according to the soft decision voltage to obtain the soft bits. In the present exemplary embodiment, the command for reading the soft bits is included in the read command sequence for reading the hard bits. Therefore, whenever one hard bit is read from one memory cell, one corresponding soft bit is also obtained. Alternatively, in another exemplary embodiment, the command for reading the soft bits are implemented in a read command sequence dedicated for reading the soft bits, and such read command sequence may be sent at any time point. For example, such read command sequence may only be sent to the rewritable non-volatile memory module 106 if it is determined that an error occurs in one or more hard bits, so as to obtain the corresponding soft bit, but the invention is not limited thereto.

Figure 8:
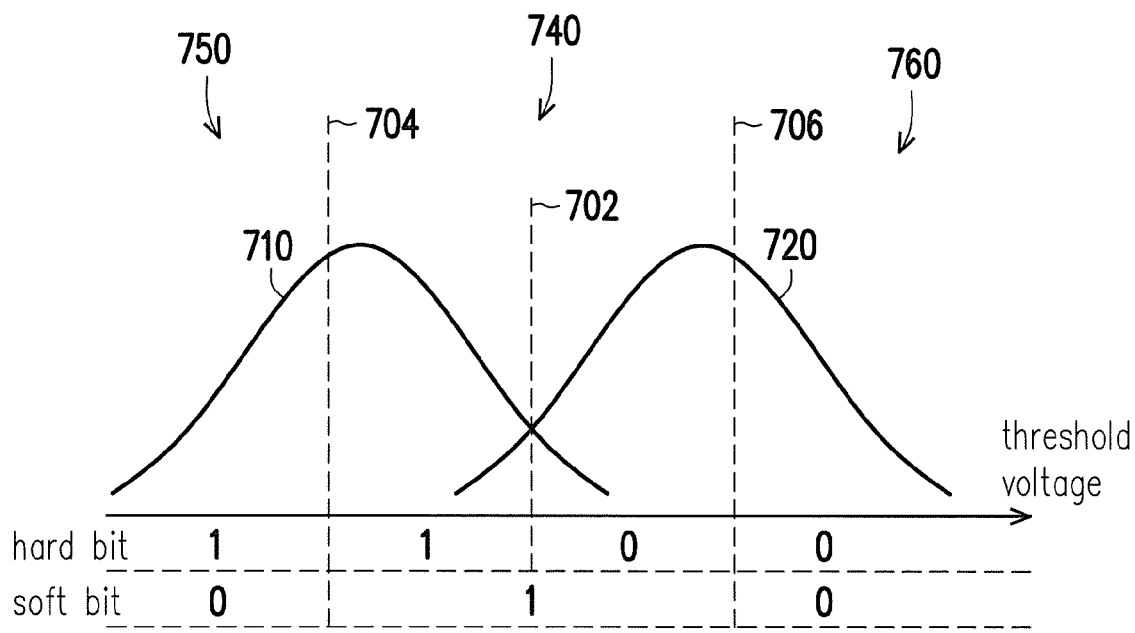
FIG. 8 is a schematic diagram illustrating the hard bit and the soft bit corresponding to the distributions of threshold voltages of the SLC-type flash memory module according to an exemplary embodiment.

FIG. 8 is a schematic diagram illustrating that the hard bit and the soft bit corresponding to the distributions of threshold voltages of the SLC-type flash memory module according to an exemplary embodiment.

Referring to FIG. 8, take the SLC-type flash memory module for example, after one read command sequence is issued to the rewritable non-volatile memory module 106, as in correspondence to each of the memory cells being read, the rewritable non-volatile memory module 106 may return one hard bit and the corresponding soft bit. Particularly, a transmission order and a transmission time for the hard bit and the soft bit are not particularly limited in the invention. For example, in an exemplary embodiment, the rewritable non-volatile memory module 106 may transmit one corresponding soft bit each time one hard bit is sent. Alternatively, in another exemplary embodiment, the rewritable non-volatile memory module 106 may transmit at least parts of the hard bits first before transmitting at least parts of the corresponding soft bits and so on, which is not particularly limited in the invention.

As shown in FIG. 8, in this exemplary embodiment, if the hard bit is "1" and the corresponding soft bit is "0", it indicates that the corresponding memory cell may be stored with the bit "1", and the threshold voltage of such memory cell falls within the stable region 750. If the hard bit being received is "1" and the corresponding soft bit is "1", it indicates that the corresponding memory cell may be stored with the bit "1", and the threshold voltage of such memory cell falls within the unstable region 740. If the hard bit being received is "0" and the corresponding soft bit is "1", it indicates that the corresponding memory cell may be stored with the bit "0", and the threshold voltage of such memory cell falls within the unstable region 740. If the hard bit being received is "0" and the corresponding soft bit is "0", it indicates that the corresponding memory cell may be stored with the bit "0", and the threshold voltage of such memory cell falls within the stable region 760. Moreover, in the present exemplary embodiment, the soft bit is obtained by performing an exclusive OR (XOR) operation for bit values respectively read according to the soft decision voltage 704 and the soft decision voltage 706. However, in another exemplary embodiment, the soft bit may also be obtained through other logic operations, which are not particularly limited in the invention.

Figure 9:
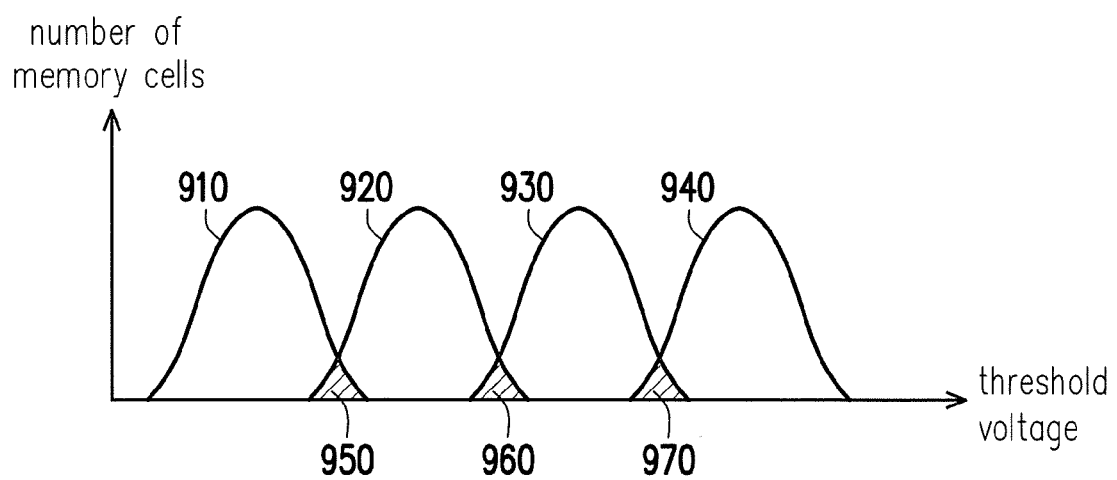
FIG. 9 is a schematic diagram illustrating distributions of threshold voltages of the MLC-type flash memory module according to an exemplary embodiment.

FIG. 9 is a schematic diagram illustrating distributions of threshold voltages of the MLC-type flash memory module according to an exemplary embodiment.

Referring to FIG. 9, take a MLC-type flash memory for example, in which each of the memory cells has four storage statuses depending on the different threshold voltages, and the storage statuses represent bits "11", "10", "00" and "01", respectively. For example, if the threshold voltage of a specific memory cell falls within a distribution 910, the bit stored in that specific memory cell is the bit "11". If the threshold voltage of a specific memory cell falls within a distribution 920, the bit stored in that specific memory cell is the bit "10". If the threshold voltage of a specific memory cell falls within a distribution 930, the bit stored in that specific memory cell is the bit "00". If the threshold voltage of a specific memory cell falls within a distribution 940, the bit stored in that specific memory cell is the bit "01".

In this exemplary embodiment, each of the memory cells may store two bits. In other words, each of the storage statuses includes a least significant bit (LSB) and a most significant bit (MSB), and the LSB and the MSB are obtained according to the different hard decision voltages applied to the memory cell. In the present exemplary embodiment, among in the storage statuses (i.e., "11", "10", "00" and "01"), a first bit counted from the left is the LSB, and a second bit counted from the left is the MSB. In another exemplary embodiment, the storage statuses corresponding to the threshold voltages may also have an arrangement of "11", "10", "01" and "00" that is arranged according to the threshold voltage from small to large, or other arrangements. In addition, in another exemplary embodiment, it can also be defined that the first bit counted from the left is the MSB, and the second bit counted from the left is the LSB. It should be noted that, in overlap regions 950 to 970, the threshold voltages of some memory cells are overlapping to have higher probability of having errors in the LSB and the MSB being read.

Figure 10:
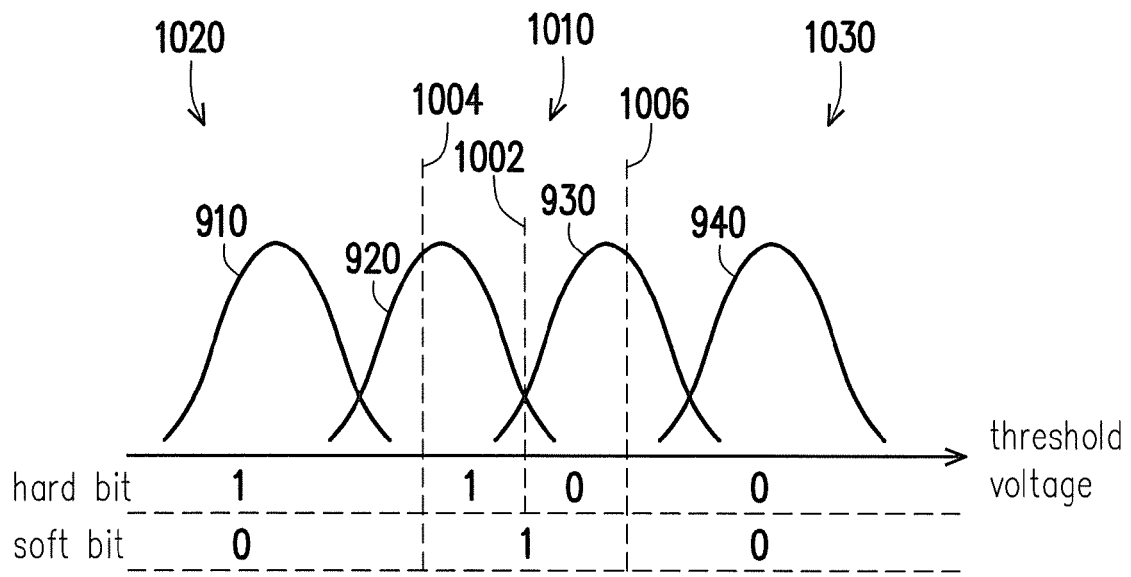
FIG. 10 and FIG. 11 are schematic diagrams illustrating that the hard bit and the soft bit corresponding to the distributions of threshold voltages of the MLC-type flash memory module according to an exemplary embodiment.
Figure 11:
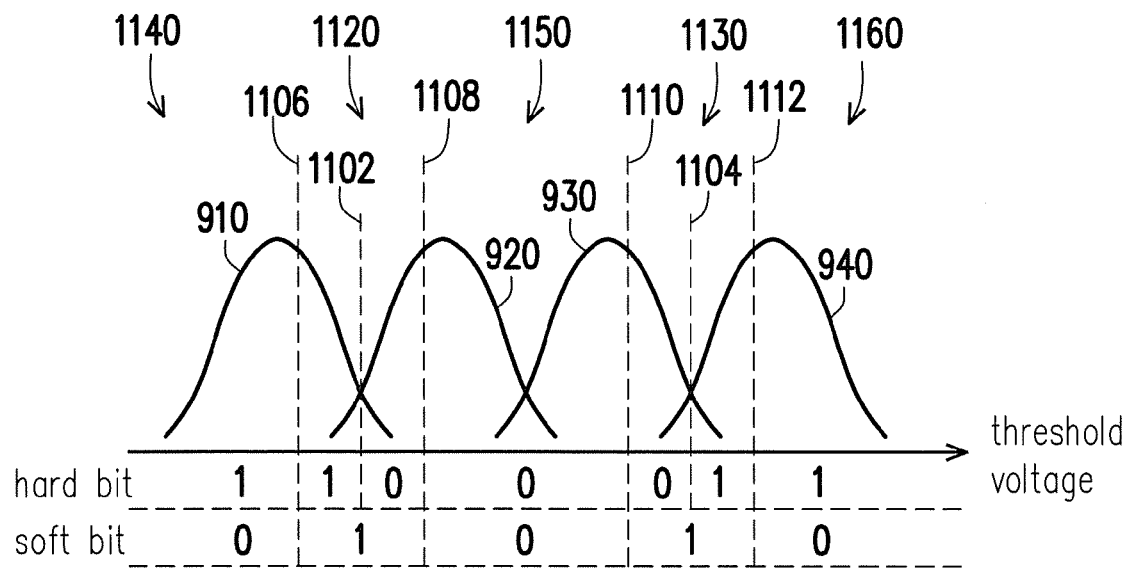

FIG. 10 and FIG. 11 are schematic diagrams illustrating that the hard bit and the soft bit corresponding to the distributions of threshold voltages of the MLC-type flash memory module according to an exemplary embodiment.

Referring to FIG. 10, take the MLC-type flash memory module for example, when it comes to read the LSB of a specific memory cell, according to a hard decision voltage 1002, a soft decision voltage 1004 and a soft decision voltage 1006 being applied, the distributions 910 to 940 are divided into an unstable region 1010, a stable region 1020 and a stable region 1030, and one hard bit and the corresponding soft bit will be obtained. Therein, the hard bit is the LSB of that specific memory cell, and the soft bit indicates, corresponding to the hard bit, the threshold voltage of that specific memory cell may fall within the stable region or the unstable region. As shown in FIG. 10, if the hard bit is "1" and the corresponding soft bit is "0", it indicates that the LSB of the corresponding memory cell may be "1", and the threshold voltage of such memory cell falls within the stable region 1020.

Referring to FIG. 11, when it comes to read the MSB of a specific memory cell, according to a hard decision voltage 1102, a hard decision voltage 1104, a soft decision voltage 1106, a soft decision voltage 1108, a soft decision voltage 1110 and a soft decision voltage 1112 being applied, the distributions 910, 920, 930 and 940 are divided into an unstable region 1120, an unstable region 1130, a stable region 1040, a stable region 1150 and a stable region 1160, and one hard bit and the corresponding soft bit will be obtained. Therein, the hard bit is the MSB of that specific memory cell, and the soft bit indicates, corresponding to the hard bit, the threshold voltage of that specific memory cell may fall within the stable region or the unstable region. As shown in FIG. 11, if the hard bit is "0" and the corresponding soft bit is "1", it indicates that the MSB of the corresponding memory cell may be "0", and the threshold voltage of such memory cell falls within the unstable region 1120 or the unstable region 1130.

Figure 12:
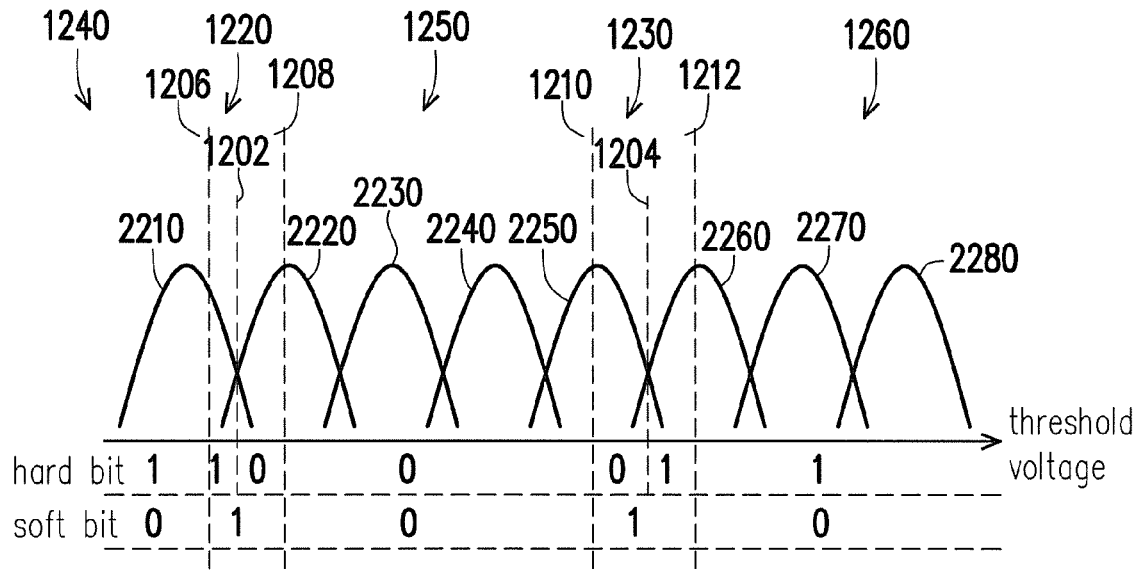
FIG. 12 to FIG. 14 are schematic diagrams illustrating that the hard bit and the soft bit corresponding to the distributions of threshold voltages of the TLC-type flash memory module according to an exemplary embodiment.
Figure 13:
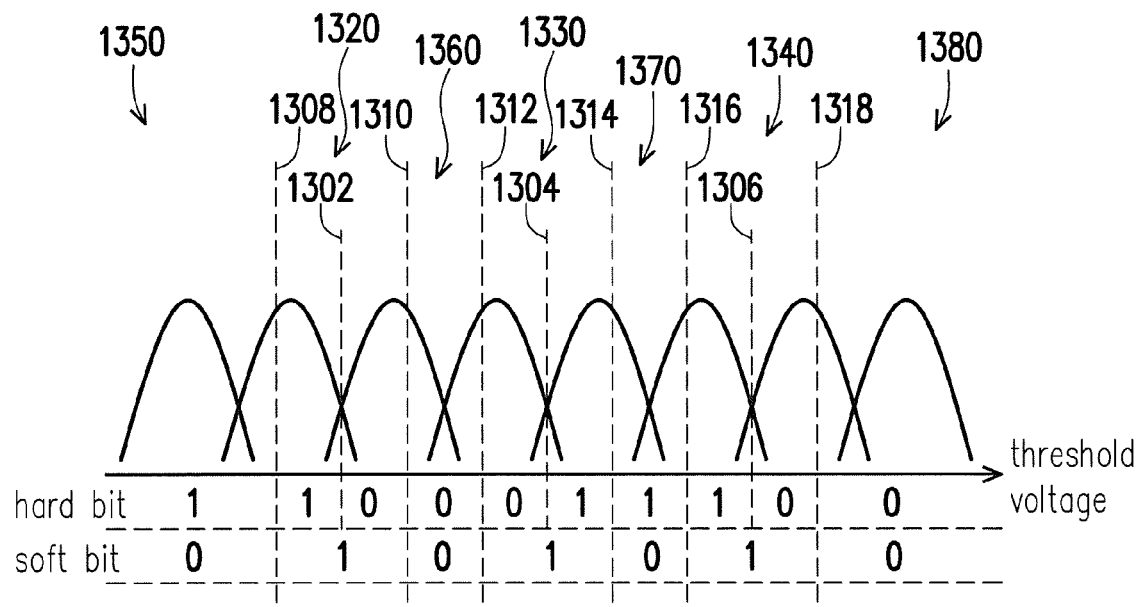
Figure 14:
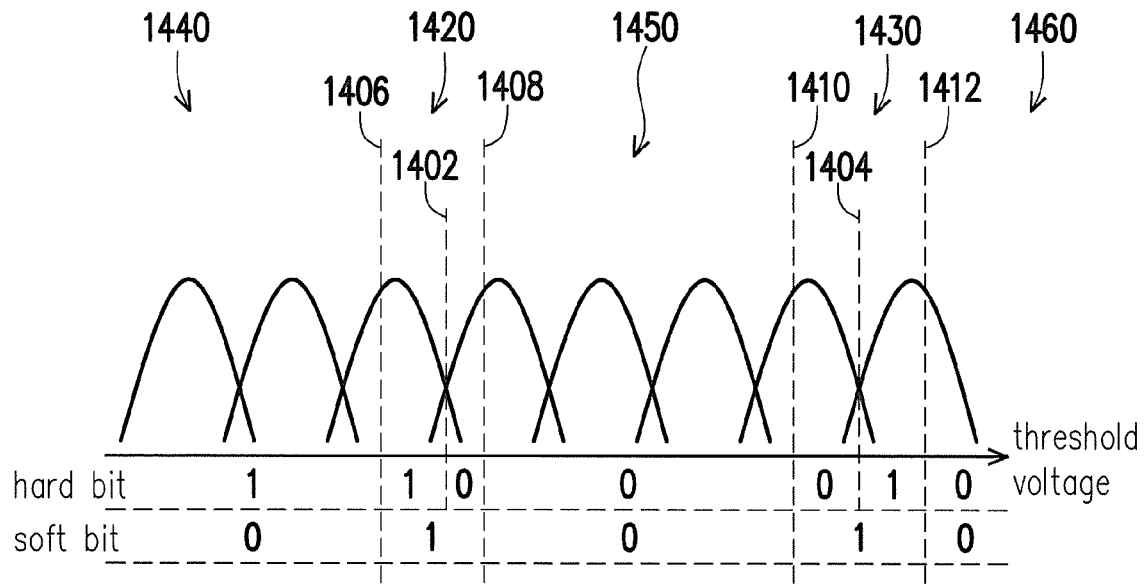

FIG. 12 to FIG. 14 are schematic diagrams illustrating that the hard bit and the soft bit corresponding to the distributions of threshold voltages of the TLC-type flash memory module according to an exemplary embodiment.

Referring to FIG. 12, take a TLC-type flash memory for example, in which the memory cells have eight storage statuses (i.e., "111", "110", "100", "101", "001", "000", "010" and "011") depending on the different threshold voltages, and the statuses are corresponding to distributions 2210, 2220, 2230, 2240, 2250, 2260, 2270 and 2280, respectively. Each of the storage statues includes three bits including: a first bit counted from the left being the least significant bit (LSB), a second bit counted from the left being a center significant bit (CSB), and a third bit counted from the left being the most significant bit (MSB). It should be noted that, an arranging sequence of the eight storage statuses may be decided based on designs of manufacturers without being limited by the arranging sequence of this embodiment.

When it comes to read the LSB of a specific memory cell, according to a hard decision voltage 1202, a hard decision voltage 1204, a soft decision voltage 1206, a soft decision voltage 1208, a soft decision voltage 1210 and a soft decision voltage 1212 being applied, the distributions 2210, 2220, 2230, 2240, 2250, 2260, 2270 and 2280 are divided into an unstable region 1220, an unstable region 1230, a stable region 1240, a stable region 1250 and a stable region 1260, and one hard bit and the corresponding soft bit will be obtained. Therein, the hard bit is the LSB of that specific memory cell, and the soft bit indicates, corresponding to the hard bit, the threshold voltage of that specific memory cell may fall within the stable region or the unstable region. As shown in FIG. 12, if the hard bit is "1" and the corresponding soft bit is "1", it indicates that the LSB of the corresponding memory cell may be "1", and the threshold voltage of such memory cell falls within the unstable region 1220 or the unstable region 1230.

Referring to FIG. 13, when it comes to read the CSB of a specific memory cell, according to a hard decision voltage 1302, a hard decision voltage 1304, a hard decision voltage 1306, a soft decision voltage 1308, a soft decision voltage 1310, a soft decision voltage 1312, a soft decision voltage 1314, a soft decision voltage 1316 and a soft decision voltage 1318 being applied, the distributions 2210, 2220, 2230, 2240, 2250, 2260, 2270 and 2280 are divided into an unstable region 1320, an unstable region 1330, an unstable region 1340, a stable region 1350, a stable region 1360, a stable region 1370 and a stable region 1380, and one hard bit and the corresponding soft bit will be obtained. Therein, the hard bit is the CSB of that specific memory cell, and the soft bit indicates, corresponding to the hard bit, the threshold voltage of that specific memory cell may fall within the stable region or the unstable region. As shown in FIG. 13, if the hard bit is "0" and the corresponding soft bit is "1", it indicates that the CSB of the corresponding memory cell may be "0", and the threshold voltage of such memory cell falls within the unstable region 1320, the unstable region 1330 or the unstable region 1340.

Referring to FIG. 14, when it comes to read the MSB of a specific memory cell, according to a hard decision voltage 1402, a hard decision voltage 1404, a soft decision voltage 1406, a soft decision voltage 1408, a soft decision voltage 1410 and a soft decision voltage 1412 being applied, the distributions 2210, 2220, 2230, 2240, 2250, 2260, 2270 and 2280 are divided into an unstable region 1420, an unstable region 1430, a stable region 1440, a stable region 1450 and a stable region 1460, and one hard bit and the corresponding soft bit will be obtained. Therein, the hard bit is the MSB of that specific memory cell, and the soft bit indicates, corresponding to the hard bit, the threshold voltage of that specific memory cell may fall within the stable region or the unstable region. As shown in FIG. 14, if the hard bit is "1" and the corresponding soft bit is "0", it indicates that the MSB of the corresponding memory cell may be "1", and the threshold voltage of such memory cell falls within the stable region 1440. It is worth mentioning that, in any one among the exemplary embodiments of FIG. 7 to FIG. 14, values and amounts of the soft decision voltages and amounts of the soft bits may be adaptively increased or decreased, which are not particularly limited in the invention. In other words, according to the soft bits, the memory control circuit unit 104 (or the memory management circuit 202) may be roughly informed of whether the threshold voltage of the corresponding memory cell falls within the stable region or the unstable region. Further, with reference by the hard bit, the memory control circuit unit 104 (or the memory management circuit 202) may be more specifically informed of whether the threshold voltage of the corresponding memory cells falls with which one (or more) of the stable regions or which one (or more) of the unstable regions. For example, in the exemplary embodiment of FIG. 14, when the soft bit is 0, it indicates that the threshold voltage of the corresponding memory cell may fall within one among the stable region 1440, the stable region 1450 and the stable region 1460. Further, based on the hard bit being "1", it indicates that the threshold voltage of the corresponding memory is more likely to fall within the stable region 1440 instead of the stable region 1450 and the stable region 1460. In other words, the memory control circuit unit 104 (or the memory management circuit 202) may determine whether threshold voltage of the memory cell falls within the stable region or the unstable region according to only the soft bit, or according to both the hard bit and the corresponding soft bit, which is not particularly limited in the invention.

After the memory control circuit unit 104 (or the memory management circuit 202) reads the hard bits from the rewritable non-volatile memory module 106 according to the hard decision voltage (e.g., the hard decision voltage 702 of FIG. 7), the hard bits are divided into one or more codewords having a length being n. The error checking and correcting circuit 256 decodes each of the codewords. More specifically, the error checking and correcting circuit 256 first performs a parity check of the low density parity check algorithm for the hard bits to obtain a plurality of syndromes. For instance, the error checking and correcting circuit 256 may perform a modulo-2, matrix multiplication to the parity check matrix and one codeword, and the modulo-2, matrix multiplication may be represented by the following equation (1).

$$[H][V]=[S] \qquad (1)$$

H is the parity check matrix. V is one codeword with the dimension being n-by-1. S is a syndrome vector including the syndromes, and a dimension of the syndrome vector is m-by-1. The error checking and correcting circuit 256 may determine whether the hard bit in the codeword V has the error according to the syndromes. More specifically, in case each of the syndromes in the syndrome vector S is the bit "0", this indicates that the codeword V may not have the error. In case one or more of the syndromes in the syndrome vector S is the bit "1", this indicates that the codeword V has at least one error.

Figure 15:
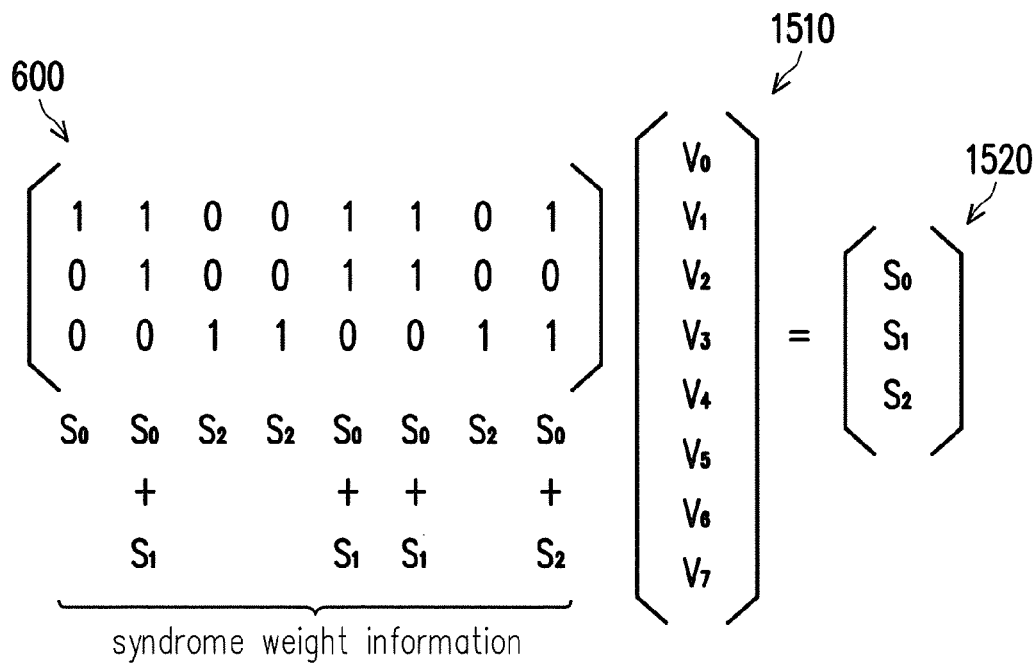
FIG. 15 is a schematic diagram illustrating a matrix multiplication according to an exemplary embodiment.

FIG. 15 is a schematic diagram illustrating a matrix multiplication according to an exemplary embodiment.

Referring to FIG. 15, a result of multiplying the parity check matrix 600 by a codeword 1510 is a syndrome vector 1520. Each of the hard bits in the codeword 1510 is corresponding to at least one syndrome in the syndrome vector 1520. For instance, a first hard bit $V_0$, (which is corresponding to first row of the parity check matrix 600) in the codeword 1510 is corresponding to a syndrome $S_0$; and a hard bit $V_1$, (which is corresponding to second row of the parity check matrix 600) is corresponding to a syndrome $S_0$, and a syndrome $S_1$. If the error occurs in the hard bit $V_0$, the syndrome $S_0$, may be the bit "1". If the error occurs in the bit $V_1$, the syndromes $S_0$, and $S_1$, may be the bit "1". In other words, in case an element at an $i^{th}$, column and a $j^{th}$, row in the parity check matrix 600 is "1", a $j^{th}$, bit in the codeword 1510 is at least corresponding to an $i^{th}$, syndrome in the syndrome vector 1520, and i and j are positive integers.

If the hard bits in the codeword 1510 do not have error, the error checking and correcting circuit 256 may output the hard bits in the codeword 1510. If the hard bits in the codeword 1510 have the error, the error checking and correcting circuit 256 may perform an iteration calculation to update the codeword 1510 according to the channel information of each of the hard bits in the codeword 1510 and syndrome weight information corresponding to each of the hard bits. More specifically, the error checking and correcting circuit 256 obtains the syndrome weight information corresponding to each of the hard bits according to the syndromes corresponding to each of the hard bits. For instance, the error checking and correcting circuit 256 may add the syndromes corresponding to the same bits together, so as to obtain the syndrome weight information corresponding to such hard bit. As shown in FIG. 15, the syndrome weight information corresponding to the hard bit $V_0$, is equal to the syndrome $S_0$; the syndrome weight information corresponding to the hard bit $V_1$, is equal to a sum of the syndrome $S_0$, and syndrome $S_1$, the rest may be deduced by analogy. It should be noted that, the addition for the syndromes $S_0$, to $S_2$, is a normal addition instead of the modulo-2, addition. However, in another exemplary embodiment, the error checking and correcting circuit 256 may also multiply each of the syndromes by a weight, and accumulate a result of multiplying the syndromes by the weight to obtain the syndrome weight information. For instance, the syndrome weight information corresponding to the hard bit $V_1$, is equal to $W_0S_0+W_1S_1$, and the weights $W_0$, and $W_1$, are real numbers. The error checking and correcting circuit 256 may decide the weights according to amount of the hard bits corresponding to the syndromes. For instance, the syndrome $S_0$, is corresponding to 5, hard bits, and the syndrome $S_1$, is corresponding to 3, hard bits. Accordingly, the error checking and correcting circuit 256 may set the weight $W_0$, as to be less than (or greater than) the weight $W_1$.

Methods for setting the weight of each of the syndromes are not particularly limited in the invention. In another exemplary embodiment, the error checking and correcting circuit 256 may also use at least one of the syndromes $S_0$, to $S_2$, as an input of a function, and uses the output of the function as the syndrome weight information. The function can be a linear function, a polynomial function, an exponential function or other nonlinear functions, and the invention is not limited to the above.

After the syndrome weight information corresponding to each of the hard bits is obtained, the error checking and correcting circuit 256 may determine whether the syndrome weight information corresponding to each of the hard bits in the codeword 1510 matches a weight condition. For example, the error checking and correcting circuit 256 may compare the syndrome weight information corresponding to each of the hard bits, and consider that a N number of the syndrome weight information with the largest value are the syndrome weight information matching the weight condition. Therein, N is a positive integer. For instance, assuming that N=4; the syndrome weight information corresponding to the hard bits $V_0$, to $V_7$, obtained by the error checking and correcting circuit 256 are respectively "1", "2", "1", "1", "2", "2", "1" and "2", and the syndrome weight information corresponding to the hard bits $V_1$, $V_4$, $V_5$, and $V_7$, are the four with the largest value, thus the error checking and correcting circuit 256 may consider that the syndrome weight information corresponding to the hard bits $V_1$, $V_4$, $V_5$, and $V_7$, are the syndrome weight information matching the weight condition. Nevertheless, if N is less than 4, the error checking and correcting circuit 256 may select one to three from among the hard bits $V_1$, $V_4$, $V_5$, and $V_7$, randomly or in accordance with other rules to serve as the hard bit(s) corresponding to the syndrome weight information matching the weight condition. Next, assuming that the syndrome weight information (also known as a first syndrome weight information) corresponding to the hard bit $V_1$, matches the weight condition, the error checking and correcting circuit 256 may further determine whether the channel information of the hard bit $V_1$, matches a channel condition. For example, the error checking and correcting circuit 256 may determine whether one or more soft bits (also known as a first soft bit) corresponding to the hard bit $V_1$, matches a first status. If the first soft bit matches the first status, the error checking and correcting circuit 256 may determine that the channel information of the hard bit $V_1$, matches the channel condition. Otherwise, if the first soft bit does not match the first status, the error checking and correcting circuit 256 may determine that the channel information of the hard bit $V_1$, does not match the channel condition.

For example, assuming that the first soft bit includes only one bit, the error checking and correcting circuit 256 may then determine whether the first soft bit is a first value. As continuation to the exemplary embodiments of FIG. 7 to FIG. 14, the first value is, for example, "1", and is configured to indicate that the threshold voltage of the memory cell corresponding to the hard bit $V_1$, falls within the unstable region. In case the first soft bit is the first value, the error checking and correcting circuit 256 may then determine that the first soft bit matches the first status. Otherwise, in case the first soft bit is not the first value, the error checking and correcting circuit 256 may then determine that the first soft bit does not match the first status. For example, as continuation to the exemplary embodiments of FIG. 7 to FIG. 14, if the value of the first soft bit corresponding to the hard bit $V_1$, is "0", it indicates that the threshold voltage of the memory cell corresponding to the hard bit $V_1$, falls within the stable region, and the error checking and correcting circuit 256 determines that the first soft bit does not match the first status. In addition, in case the first soft bit includes a plurality of bits, the first status may be configured to limit a status of each bit of the first soft bit. For example, if the first soft bit includes three bits, the first status may be "111", but not limited thereto.

If the channel information of the hard bit $V_1$, matches the channel condition, the error checking and correcting circuit 256 updates the hard bit $V_1$. For example, the hard bit $V_1$, may be updated from "0" into "1", or the hard bit $V_1$, may be updated from "1" into "0". Otherwise, if the channel information of the hard bit $V_1$, does not match the channel condition, the error checking and correcting circuit 256 does not update the hard bit $V_1$. In an exemplary embodiment, the operation of updating the hard bit may also be referred to as a bit flipping.

Moreover, in an exemplary embodiment, if the hard bit in the codeword 1510 has the error, the error checking and correcting circuit 256 may also decide which one of the hard bits in the codeword 1510 is to be updated simply according to the channel information of each of the hard bits in the codeword 1510. For example, the error checking and correcting circuit 256 may check whether the channel information of each of the hard bits in the codeword 1510 matches said channel condition, and only update the hard bits having the channel information matching the channel condition. Accordingly, computations may be reduced to increase a speed of each iteration calculation.

After the hard bits required to be updated in the codeword 1510 are all updated, the error checking and correcting circuit 256 may perform the parity checking procedure for the hard bits in the updated codeword 1510 to obtain the syndromes again, and determine whether the hard bits in the updated codeword 1510 still has the at least one error according to the syndromes being obtained again. If the hard bits in the updated codeword 1510 still have the error, the error checking and correcting circuit 256 may perform the aforesaid operation of updating the hard bits according to the channel information of each of the hard bits in the codeword 1510 and the syndrome weight information corresponding to each of the hard bits again. Otherwise, if the hard bits in the codeword 1510 do not have the error, the error checking and correcting circuit 256 may output the updated hard bits in the codeword 1510.

In an exemplary embodiment, if the error checking and correcting circuit 256 determines that the codeword 1510 has the error, the error checking and correcting circuit 256 may count a number of iterations (e.g., by adding one to the number of iterations), and determine whether the number of iterations reaches a suspend number. Herein, the suspend number may be 30, times, or more or less for example. If the number of iterations being counted reaches the suspend number, the error checking and correcting circuit 256 may determine that decoding fails, and stop decoding. If the number of iterations being counted does not reach the suspend number, the error checking and correcting circuit 256 may perform the aforesaid operation of updating the hard bits according to the channel information of each of the hard bits in the codeword 1510 and the syndrome weight information corresponding to each of the hard bits.

In an exemplary embodiment, the error checking and correcting circuit 256 may also determine whether the number of iterations being counted reaches a preset number. Herein, the preset number is less than the suspend number, and may be 20 times, or more or less, for example. If the number of iterations being counted does not reach the preset number, the error checking and correcting circuit 256 may set the channel condition to a first channel condition. If the number of iterations being counted reaches the preset number, the error checking and correcting circuit 256 may set the channel condition to a second channel condition. Therein, the first channel condition is different from the second channel condition. For instance, in the exemplary embodiment of FIG. 8, assuming that the soft bit corresponding to a specific hard bit is "0" in the first 20, times of the iteration calculations, it indicates that specific hard bit is not updated. After 20, times of the iteration calculations, if the error checking and correcting circuit 256 still cannot obtain a correct codeword, the channel condition may be relaxed by the error checking and correcting circuit 256, so that the specific hard bit may be updated to increase probability of obtaining the correct codeword.

Figure 16:
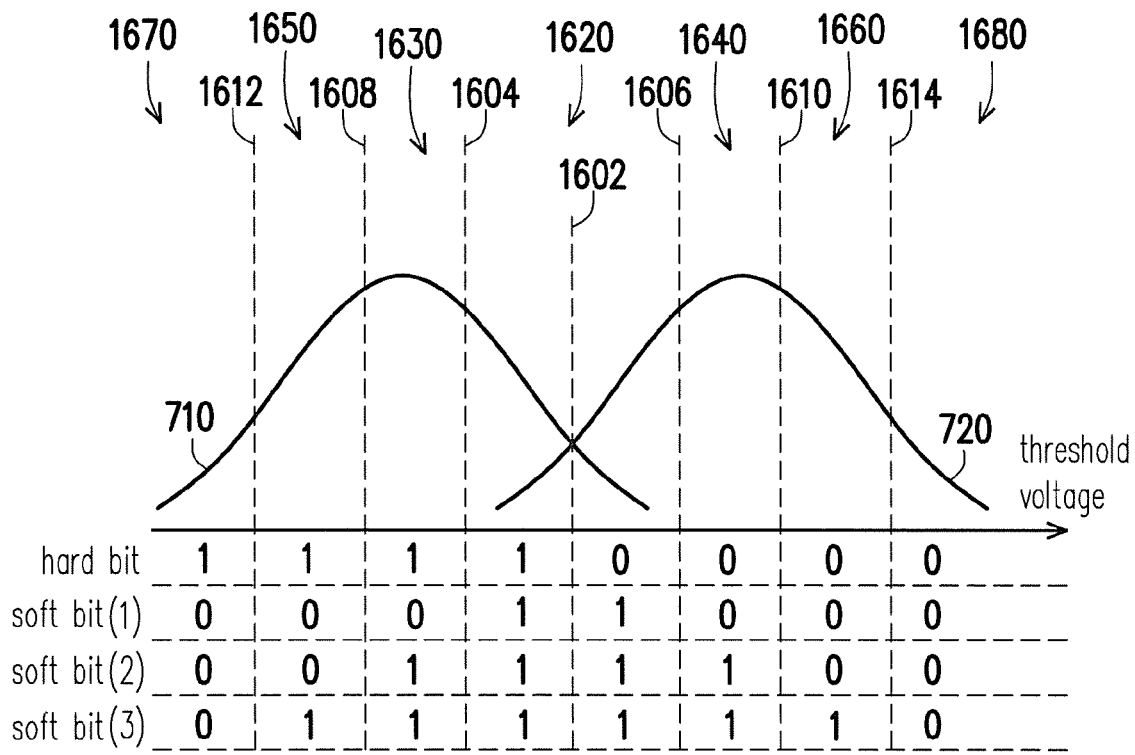
FIG. 16 is a schematic diagram illustrating that the hard bit and the soft bit corresponding to the distributions of threshold voltages of the SLC-type flash memory module according to an exemplary embodiment.

FIG. 16 is a schematic diagram illustrating that the hard bit and the soft bit corresponding to the distributions of threshold voltages of the SLC-type flash memory module according to an exemplary embodiment.

Referring to FIG. 16, in the present exemplary embodiment, the channel information of each of the hard bits includes a plurality of soft bits. The soft bits have a plurality of statuses. Based on different statuses of the soft bits, the threshold voltage of the memory cell corresponding to the hard bit may be more specifically classified into one of a plurality of hierarchies. Referring to FIG. 16, when it comes to read a specific memory cell, according to a hard decision voltage 1602, a soft decision voltage 1604, a soft decision voltage 1606, a soft decision voltage 1608, a soft decision voltage 1610, a soft decision voltage 1612 and a soft decision voltage 1614 being applied, the distributions 710 and 720 are divided into an unstable region 1620, a stable region 1630, a stable region 1640, a stable region 1650, a stable region 1660, a stable region 1670 and a stable region 1680, and one hard bit and the corresponding soft bit (1) to the soft bit (3) will be obtained. Therein, the soft bit (1) is obtain by performing the exclusive OR operation for the bit values respectively read according to the soft decision voltage 1604 and the soft decision voltage 1606; the soft bit (2) is obtain by performing the exclusive OR operation for the bit values respectively read according to the soft decision voltage 1608 and the soft decision voltage 1610; and the soft bit (3) is obtain by performing the exclusive OR operation for the bit values respectively read according to the soft decision voltage 1612 and the soft decision voltage 1614. For instance, if the status of the soft bit (1) to the soft bit (3) is "111", it indicates that the threshold voltage of the memory cell corresponding to the hard bit falls within the unstable region 1620; if the hard bit is "0" and the status of the soft bit (1) to the soft bit (3) is "011", it indicates that the threshold voltage of the memory cell corresponding to the hard bit falls within the stable region 1640; and the rest may be deduced by analogy. In other words, if the status of the soft bit (1) to the soft bit (3) is "000", it indicates that the probability for the error to occur on such hard bit is the smallest. If the status of the soft bit (1) to the soft bit (3) is "001" or "011", it indicates that the probability for the error to occur on such hard bit gradually increases. If the status of the soft bit (1) to the soft bit (3) is "111", it indicates that the probability for the error to occur on such hard bit is the highest. However, in another exemplary embodiment, if the logic operation (e.g., the exclusive OR operation) is not performed for the soft bits being read, or the amount of the logic operations is increased/decreased, the amount of the soft bits included in the channel information may be more or less.

In the present exemplary embodiment, assuming that throughout the iteration calculations of a first to a $P^{th}$, times, the preset channel condition is: the status of the soft bit (1) to the soft bit (3) being "111". Throughout the iteration calculations of the first to the $P^{th}$, times, even if the syndrome weight information corresponding to a specific hard bit matches the weight condition, as long as the status of the soft bit (1) to the soft bit (3) corresponding to that specific hard bit is not "111", the specific hard bit will not be updated. After the iteration calculation of the $p^{th}$, time is completed, the channel condition is changed to: the status of the soft bit (1) to the soft bit (3) being "011". Accordingly, after the iteration calculation of the $P^{th}$, time is completed, if the syndrome weight information of a specific hard bit matches the weight condition, and the soft bit (1) to the soft bit (3) corresponding to that specific hard bit matches the channel condition being changed, that specific hard bit may then be updated to increase probability of obtaining the correcting codeword. In addition, throughout the iteration calculations of a $(P+1)^{th}$, to a $Q^{th}$, times, the channel condition may also be set to: the status of the soft bit (1) to the soft bit (3) being "001"; and, throughout the iteration calculations of a $(Q+1)^{th}$, to a $R^{th}$, times, the channel condition may also be set to: no specific conditions, or the channel condition only being applied with minor changes. Therein, P, Q and R are positive integers, and R>Q>P. Moreover, in an exemplary embodiment, the channel condition may also be set to: the status of the soft bit (1) and the soft bit (3) always being "111", or there is always no condition, which are not changed with increases in the number of iterations.

It is worth mentioning that, the channel information of the hard bit is not necessarily to be obtained by reading the memory cells according to the soft decision voltage. In an exemplary embodiment, the memory control circuit unit 104 (or the memory management circuit 202) may also read a read result of a specific memory cell according to different hard decision voltages, so as to be informed of whether the threshold voltage of that specific memory cell falls within the stable region or the unstable region, and thereby decide the channel information of the hard bit read from that specific memory cell.

More specifically, take FIG. 15 as an example, in an exemplary embodiment, assuming that the memory control circuit unit 104 (or the memory management circuit 202) is initially not informed of whether the threshold voltage of each of the memory cells composing the physical programming unit falls within the stable region or the unstable region. Therefore, after the hard bits in the codeword 1510 are obtained, the memory control circuit unit 104 (or the memory management circuit 202) may consider that the channel information of each of the hard bits in codeword 1510 matches the channel condition, and update the hard bits that needs to be updated in the codeword 1510 according to the syndrome weight information corresponding to each of the hard bits. Then, if decoding fails, the memory control circuit unit 104 (or the memory management circuit 202) may obtain at least one new hard decision voltage by querying a look-up table, or slightly increasing or decreasing the hard decision voltage (i.e., the old hard decision voltage), and then send a new read command sequence to the rewritable non-volatile memory module 106. The new read command sequence includes one or more commands or program codes, and is configured to instruct for reading the physical programming unit composed of a plurality of memory cells according to the new hard decision voltage to obtain a plurality of new hard bits. Thereafter, the memory control circuit unit 104 (or the memory management circuit 202) may compare whether the hard bits read from a specific memory cell according to the old hard decision voltage is identical to the new hard bits read from that specific memory cell according to the new hard decision voltage. If they are identical, it indicates that the threshold voltage of the memory cell falls within the stable region; and if they are not identical, it indicates that the threshold voltage of the memory cell falls within the unstable region. The memory control circuit unit 104 (or the memory management circuit 202) may decide the channel information of the new hard bits based on whether the threshold voltage of the memory cell falls within the stable region or the unstable region. For example, if it is determined that the threshold voltage falls within the stable region, the memory control circuit unit 104 (or the memory management circuit 202) may set the soft bit corresponding to the new hard bit to "0"; and if it is determined that the threshold voltage falls within the unstable region, the memory control circuit unit 104 (or the memory management circuit 202) may set the soft bit corresponding to the new hard bit to "1", but the invention is not limited thereto. Alternatively, after the memory cell is read by using a specific amount of hard decision voltages, the memory control circuit unit 104 (or the memory management circuit 202) may also determine that the threshold voltage of the memory cell falls within the unstable region if a number of changes (which includes changing from "0" to "1" and changing from "1" to "0") of the hard bits being read exceeds a specific number of times, or else determine that threshold voltage falls within the stable region. In addition, this method of deciding the channel information according to the number of changes of the hard bits may be used together with the soft bits obtained according to the soft decision voltage, which is not particularly limited in the invention.

It is worth mentioning that, in each of the foregoing exemplary embodiments, the stable region may also be named as a high reliable region or names with similar meaning, and the unstable region may also be named as a low reliable region or names with similar meaning, or they can be named in a hierarchical way. For example, in the exemplary embodiment of FIG. 16, the region 1620 may be named as a lowest stable (reliable) region; the region 1630 and the region 1640 may be named as second lowest stable (reliable) regions; the region 1650 and the region 1660 may be named as second highest stable (reliable) regions; and the region 1670 and the region 1680 may be named as highest stable (reliable) regions, but the invention is not limited thereto.

Figure 17:
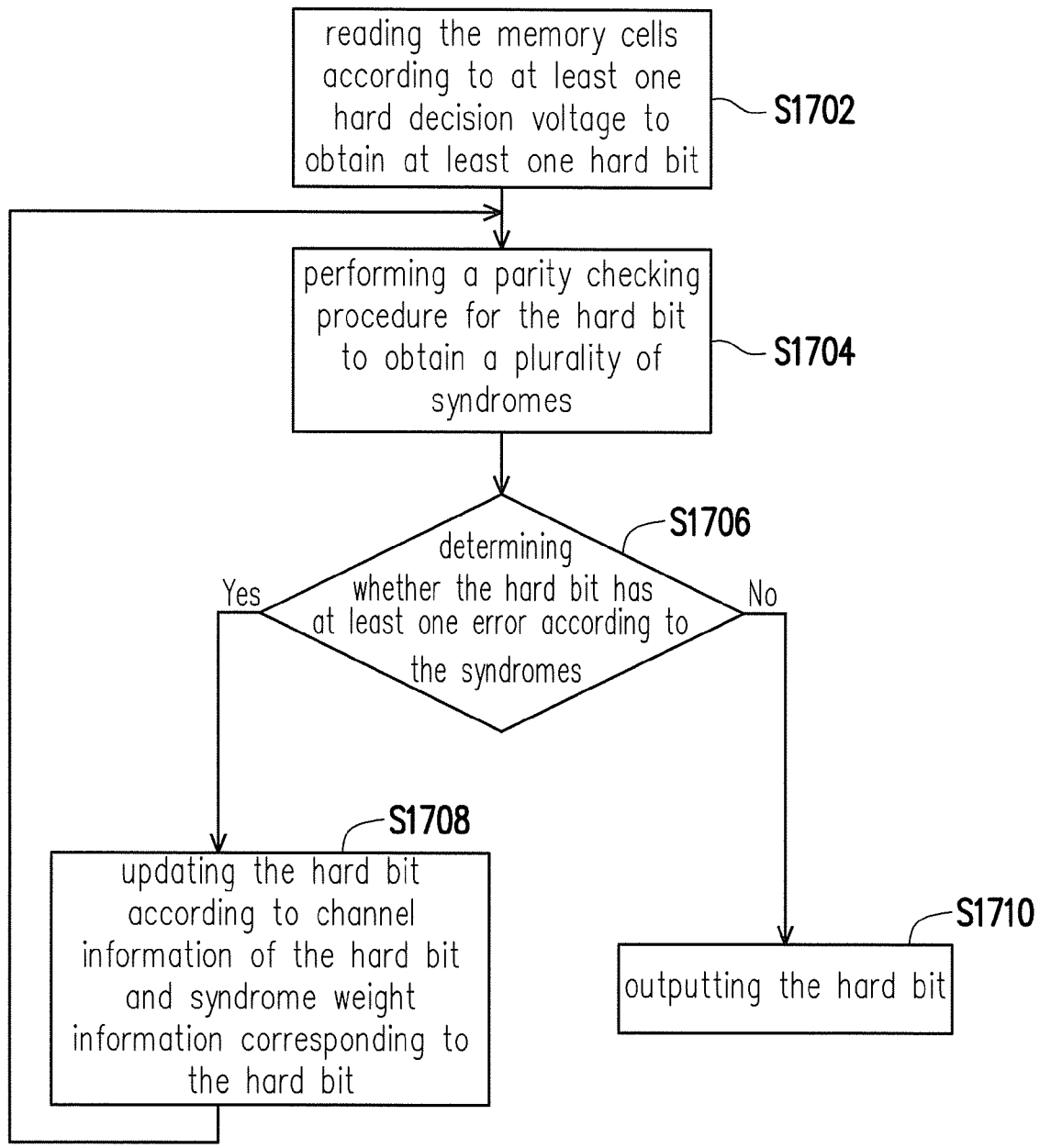
FIG. 17 is a flowchart illustrating a decoding method according to an exemplary embodiment.

FIG. 17 is a flowchart illustrating a decoding method according to an exemplary embodiment.

Referring to FIG. 17, in step S1702, the memory cells are read according to at least one hard decision voltage to obtain at least one hard bit.

In step S1704, a parity checking procedure is performed for the hard bit to obtain a plurality of syndromes, wherein each of the hard bit is corresponding to at least one of the syndromes.

In step S1706, whether the hard bit has at least one error is determined according to the syndromes.

If the hard bit has the error, the hard bit is updated according to channel information of the hard bit and syndrome weight information corresponding to the hard bit in step S1708. Thereafter, step S1704 is repeated.

If the hard bit does not have the error, the hard bit is outputted in step S1710.

Figure 18:
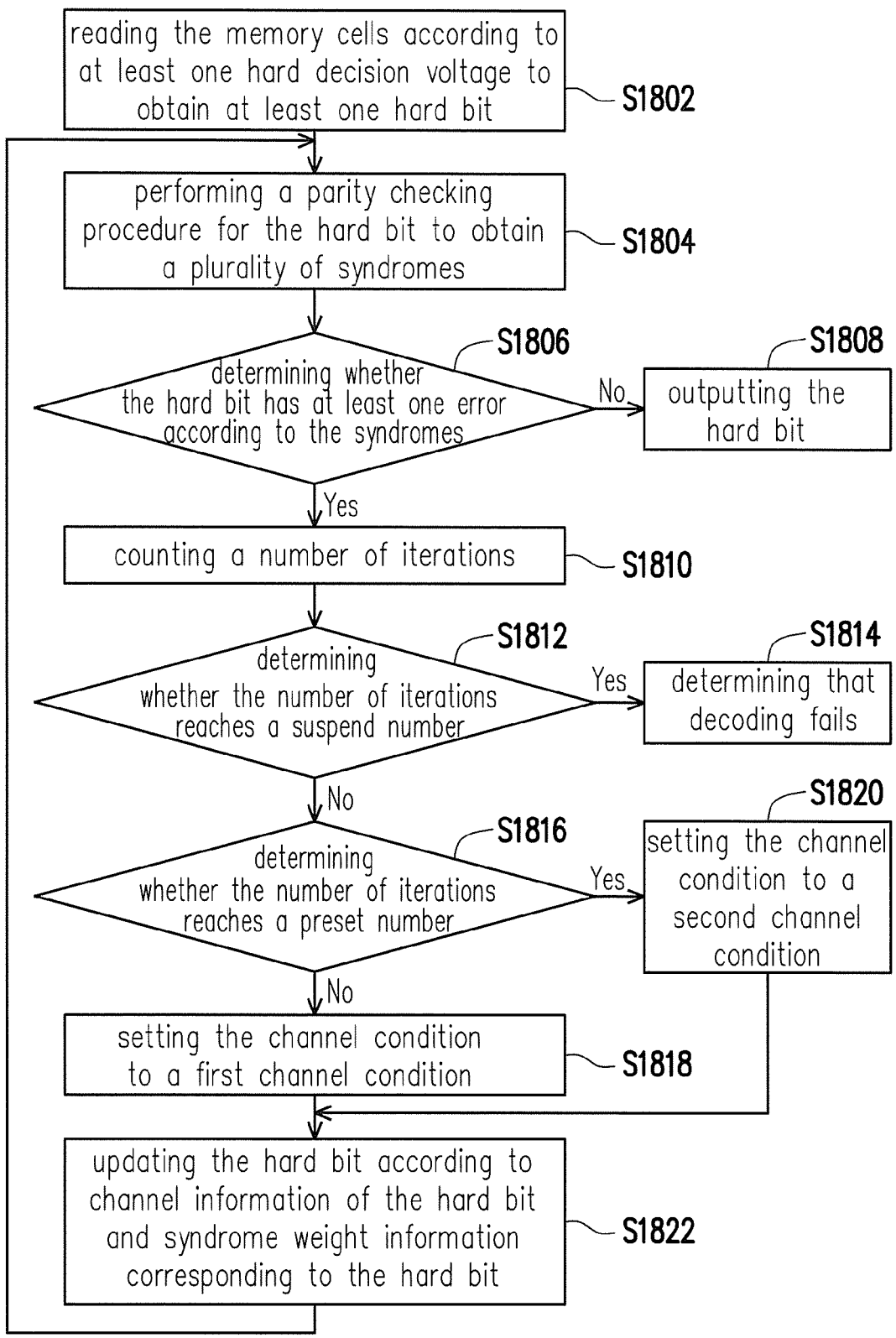
FIG. 18 is a flowchart illustrating a decoding method according to another exemplary embodiment.

FIG. 18 is a flowchart illustrating a decoding method according to another exemplary embodiment.

Referring to FIG. 18, in step S1802, the memory cells are read according to at least one hard decision voltage to obtain at least one hard bit.

In step S1804, a parity checking procedure is performed for the hard bit to obtain a plurality of syndromes, wherein each of the hard bit is corresponding to at least one of the syndromes.

In step S1806, whether the hard bit has at least one error is determined according to the syndromes.

If the hard bit does not have the error, the hard bit is outputted in step S1808.

If the hard bit has the error, a number of iterations is counted in step S1810, and whether the number of iterations reaches a suspend number is determined in step S1812.

If the number of iterations reaches the suspend number, it is determined that decoding fails in step S1814.

If the number of iterations does not reach the suspend number, whether the number of iterations reaches a preset number is determined in step S1816. Herein, the preset number is less than the suspend number.

If the number of iterations does not reach the preset number, the channel condition is set to a first channel condition in step S1818. If the channel condition at the time is already the first channel condition, step S1818 may be omitted.

If the number of iterations reaches the preset number, the channel condition is set to a second channel condition in step S1820.

In step S1822, the hard bit is updated according to channel information of the hard bit and syndrome weight information corresponding to the hard bit. Thereafter, step S1804 is repeated.

In an exemplary embodiment, whether a number of times that decoding fails reaches a specific number of times may be determined in step S1814. If the specific number of times is not yet reached, step S1802 is performed repeatedly. For example, the memory control circuit unit 104 (or the memory management circuit 202) may issue another read command sequence to the rewritable non-volatile memory module 106, so as to read the memory cells according to another hard decision voltage which is different from the hard decision voltage being used previously, and obtain the at least one hard bit again. Thereafter, step S1804 and step S1806 and so on are successively performed. Otherwise, if the number of times that decoding fails reaches the specific number of times, this decoding procedure is stopped.

Nevertheless, each of steps depicted in FIG. 17 and FIG. 18 have been described in detail as above, thus related description thereof is omitted hereinafter. It should be noted that, the steps depicted in FIG. 17 and FIG. 18 may be implemented as a plurality of program codes or circuits, and the invention is not limited thereto. Moreover, the methods disclosed in FIG. 17 and FIG. 18 may be implemented with reference to above embodiments, or may be implemented separately, and the invention is not limited thereto.

In summary, in the decoding method, the memory storage device and the memory control circuit unit in an embodiment of the invention, the bit flipping is adopted during the error correction, and the channel information related to the threshold voltage of the memory cell is also used together to facilitate in ensuring the bits to be flipped, so as to effectively improve decoding efficiency.

The previously described exemplary embodiments of the present invention have the advantages aforementioned, wherein the advantages aforementioned not required in all versions of the invention.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A decoding method for a rewritable non-volatile memory module comprising a plurality of memory cells, and the decoding method comprising:
reading the memory cells according to at least one hard decision voltage to obtain at least one hard bit, wherein the at least one hard bit comprises a first hard bit:
performing a parity checking procedure for the at least one hard bit to obtain a plurality of syndromes, wherein each of the at least one hard bit is corresponding to at least one of the syndromes;
determining whether the at least one hard bit has at least one error according to the syndromes;
if the at least one hard bit has the at least one error, updating the at least one hard bit according to channel information of the at least one hard bit and syndrome weight information corresponding to the at least one hard bit, wherein the step of updating the at least one hard bit according to the channel information of the at least one hard bit and the syndrome weight information corresponding to the at least one hard bit comprises:
determining whether first syndrome weight information corresponding to the first hard bit among the syndrome weight information matches a weight condition:
if the first syndrome weight information matches the weight condition, determining whether the channel information of the first hard bit matches a channel condition;
if the channel information of the first hard bit matches the channel condition, updating the first hard bit; and
if the channel information of the first hard bit does not match the channel condition, not updating the first hard bit; and
if the at least one hard bit does not have the at least one error, outputting the at least one hard bit.

2. The decoding method of claim 1, wherein the channel information of the first hard bit comprises at least one first soft bit, and the step of determining whether the channel information of the first hard bit matches the channel condition comprises:
determining whether the at least one first soft bit matches a first status;
if the at least one first soft bit matches the first status, determining that the channel information of the first hard bit matches the channel condition; and
if the at least one first soft bit does not match the first status, determining that the channel information of the first hard bit does not match the channel condition.

3. The decoding method of claim 1, wherein if the at least one hard bit has the at least one error, the decoding method further comprises:
counting a number of iterations;
determining whether the number of iterations reaches a preset number;
if the number of iterations does not reach the preset number, setting the channel condition to a first channel condition; and
if the number of iterations reaches the preset number, setting the channel condition to a second channel condition, wherein the first channel condition is different from the second channel condition.

4. The decoding method of claim 1, further comprising:
reading the memory cells according to at least one soft decision voltage to obtain the channel information of the at least one hard bit.

5. The decoding method of claim 4, wherein the at least one hard decision voltage comprises a first hard decision voltage, the at least one soft decision voltage comprises a first soft decision voltage and a second soft decision voltage, the first soft decision voltage is less than the first hard decision voltage, and the second soft decision voltage is greater than the first hard decision voltage.

6. The decoding method of claim 1, further comprising:
if decoding fails, reading the memory cells according to at least one new hard decision voltage to obtain at least one new hard bit; and
deciding the channel information of the at least one new hard bit according to the at least one hard bit and the at least one new hard bit.

7. The decoding method of claim 1, wherein if the at least one hard bit has the at least one error, the decoding method further comprises:
counting a number of iterations;
determining whether the number of iterations reaches a suspend number;
if the number of iterations reaches the suspend number, determining that decoding fails; and
if the number of iterations does not reach the suspend number, performing the parity checking procedure for the at least one updated hard bit to obtain the syndromes again, and determining whether the at least one updated hard bit has the at least one error according to the syndromes being obtained again.

8. A memory storage device, comprising:
a connection interface unit configured to couple to a host system;
a rewritable non-volatile memory module comprising a plurality of memory cells; and
a memory control circuit unit coupled to the connection interface unit and the rewritable non-volatile memory module,
wherein the memory control circuit unit is configured to read the memory cells according to at least one hard decision voltage to obtain at least one hard bit, and the at least one hard bit comprises a first hard bit,
the memory control circuit unit is further configured to perform a parity checking procedure for the at least one hard bit to obtain a plurality of syndromes, wherein each of the at least one hard bit is corresponding to at least one of the syndromes,
the memory control circuit unit is further configured to determine whether the at least one hard bit has at least one error according to the syndromes,
if the at least one hard bit has the at least one error, the memory control circuit unit is further configured to update the at least one hard bit according to channel information of the at least one hard bit and syndrome weight information corresponding to the at least one hard bit, wherein, the operation of updating the at least one hard bit according to the channel information of the at least hard bit and syndrome weight information corresponding to the at least one hard bit comprises, determining whether first syndrome weight information corresponding to the first hard bit among the syndrome weight information matches a weight condition, if the first syndrome weight information matches the weight condition, determining whether the channel information of the first hard bit matches a channel condition, if the channel information of the first hard bit matches the channel condition, updating the first hard bit, and if the channel information of the first hard bit does not match the channel condition, not updating the first hard bit, and if the at least one hard bit does not have the at least one error, the memory control circuit unit is further configured to output the at least one hard bit.

9. The memory storage device of claim 8, wherein the channel information of the first hard bit comprises at least one first soft bit, and the operation of the memory control circuit unit for determining whether the channel information of the first hard bit matches the channel condition comprises:
determining whether the at least one first soft bit matches a first status;
if the at least one first soft bit matches the first status, determining that the channel information of the first hard bit matches the channel condition; and
if the at least one first soft bit does not match the first status, determining that the channel information of the first hard bit does not match the channel condition.

10. The memory storage device of claim 8, wherein if the at least one hard bit has the at least one error, the memory control circuit unit is further configured to count a number of iterations,
the memory control circuit unit is further configured to determine whether the number of iterations reaches a preset number,
if the number of iterations does not reach the preset number, the memory control circuit unit is further configured to set the channel condition to a first channel condition, and
if the number of iterations reaches the preset number, the memory control circuit unit is further configured to set the channel condition to a second channel condition, wherein the first channel condition is different from the second channel condition.

11. The memory storage device of claim 8, wherein the memory control circuit unit is further configured to read the memory cells according to at least one soft decision voltage to obtain the channel information of the at least one hard bit.

12. The memory storage device of claim 11, wherein the at least one hard decision voltage comprises a first hard decision voltage, the at least one soft decision voltage comprises a first soft decision voltage and a second soft decision voltage, the first soft decision voltage is less than the first hard decision voltage, and the second soft decision voltage is greater than the first hard decision voltage.

13. The memory storage device of claim 8, wherein if decoding fails, the memory control circuit unit is further configured to read the memory cells according to at least one new hard decision voltage to obtain at least one new hard bit, and
the memory control circuit unit is further configured to decide the channel information of the at least one new hard bit according to the at least one hard bit and the at least one new hard bit.

14. The memory storage device of claim 8, wherein if the at least one hard bit has the at least one error, the memory control circuit unit is further configured to count a number of iterations,
the memory control circuit unit is further configured to determine whether the number of iterations reaches a suspend number,
if the number of iterations reaches the suspend number, the memory control circuit unit is further configured to determine that decoding fails, and
if the number of iterations does not reach the suspend number, the memory control circuit unit is further configured to perform the parity checking procedure for the at least one updated hard bit to obtain the syndromes again, and determine whether the at least one updated hard bit has the at least one error according to the syndromes being obtained again.

15. A memory control circuit unit, for a rewritable non-volatile memory module, wherein the rewritable non-volatile memory module comprises a plurality of memory cells, and the memory control circuit unit comprises:
a host interface configured to couple to a host system;
a memory interface configured to couple to the rewritable non-volatile memory module;
an error checking and correcting circuit; and
a memory management circuit coupled to the host interface, the memory interface and the error checking and correcting circuit,
wherein the memory management circuit is configured to send a read command sequence, wherein the read command sequence is configured to instruct for reading the memory cells according to at least one hard decision voltage to obtain at least one hard bit, wherein the at least one hard bit comprises a first hard bit,
the error checking and correcting circuit is configured to perform a parity checking procedure for the at least one hard bit to obtain a plurality of syndromes, wherein each of the at least one hard bit is corresponding to at least one of the syndromes,
the error checking and correcting circuit is further configured to determine whether the at least one hard bit has at least one error according to the syndromes,
if the at least one hard bit has the at least one error, the error checking and correcting circuit is further configured to update the at least one hard bit according to channel information of the at least one hard bit and syndrome weight information corresponding to the at least one hard bit, wherein the operation of the error checking and correcting circuit for updating the at least one hard bit according to the channel information of the at least one hard bit and the syndrome weight information corresponding to the at least one hard bit comprises determining whether first syndrome weight information corresponding to the first hard bit among the syndrome weight information matches a weight condition, if the first syndrome weight information matches the weight condition, determining whether the channel information of the first hard bit matches a channel condition, if the channel information of the first hard bit matches the channel condition, updating the first hard bit, and if the channel information of the first hard bit does not match the channel condition, not updating the first hard bit, and
if the at least one hard bit does not have the at least one error, the memory management circuit is further configured to output the at least one hard bit.

16. The memory control circuit unit of claim 15, wherein the channel information of the first hard bit comprises at least one first soft bit, and the operation of the error checking and correcting circuit for determining whether the channel information of the first hard bit matches the channel condition comprises:
- determining whether the at least one first soft bit matches a first status;
- if the at least one first soft bit matches the first status, determining that the channel information of the first hard bit matches the channel condition; and
- if the at least one first soft bit does not match the first status, determining that the channel information of the first hard bit does not match the channel condition.

17. The memory control circuit unit of claim 15, wherein if the at least one hard bit has the at least one error, the error checking and collecting circuit is further configured to count a number of iterations,
- the error checking and correcting circuit is further configured to determine whether the number of iterations reaches a preset number,
- if the number of iterations does not reach the preset number, the error checking and correcting circuit is further configured to set the channel condition to a first channel condition, and
- if the number of iterations reaches the preset number, the error checking and correcting circuit is further configured to set the channel condition to a second channel condition, wherein the first channel condition is different from the second channel condition.

18. The memory control circuit unit of claim 15, wherein the read command sequence is further configured to instruct for reading the memory cells according to at least one soft decision voltage to obtain the channel information of the at least one hard bit.

19. The memory control circuit unit of claim 18, wherein the at least one hard decision voltage comprises a first hard decision voltage, the at least one soft decision voltage comprises a first soft decision voltage and a second soft decision voltage, the first soft decision voltage is less than the first hard decision voltage, and the second soft decision voltage is greater than the first hard decision voltage.

20. The memory control circuit unit of claim 15, wherein if decoding fails, the memory management circuit is further configured to send a new read command sequence, wherein the new read command sequence is configured to instruct for reading the memory cells according to at least one new hard decision voltage to obtain at least one new hard bit, and
- the memory management circuit is further configured to decide the channel information of the at least one new hard bit according to the at least one hard bit and the at least one new hard bit.

21. The memory control circuit unit of claim 15, wherein if the at least one hard bit has the at least one error, the error checking and correcting circuit is further configured to count a number of iterations,
- the error checking and correcting circuit is further configured to determine whether the number of iterations reaches a suspend number,
- if the number of iterations reaches the suspend number, the error checking and correcting circuit is further configured to determine that decoding fails, and
- if the number of iterations does not reach the suspend number, the error checking and correcting circuit is further configured to perform the parity checking procedure for the at least one updated hard bit to obtain the syndromes again, and determine whether the at least one updated hard bit has the at least one error according to the syndromes being obtained again.

* * * * *